United States Patent [19]
Kita et al.

[11] Patent Number: 5,394,347
[45] Date of Patent: Feb. 28, 1995

[54] METHOD AND APPARATUS FOR GENERATING TESTS FOR STRUCTURES EXPRESSED AS EXTENDED FINITE STATE MACHINES

[75] Inventors: Ronald A. Kita, Hollis; Sylvia C. Tremblay, Nashua; Thomas M. Lynch, Hudson, all of N.H.

[73] Assignee: Digital Equipment Corporation, Maynard, Mass.

[21] Appl. No.: 100,002

[22] Filed: Jul. 29, 1993

[51] Int. Cl.⁶ ............................................. G06F 15/60
[52] U.S. Cl. ...................................... 364/578; 364/191
[58] Field of Search ............... 364/578, 579, 580, 489, 364/490, 488, 191; 395/500, 922; 371/19, 23, 22.2, 27

[56] References Cited

U.S. PATENT DOCUMENTS

| | | | |
|---|---|---|---|
| 4,694,411 | 9/1987 | Burrows | 364/578 |
| 4,809,202 | 2/1989 | Wolfram | 364/578 |
| 4,972,334 | 11/1990 | Yamabe et al. | 364/191 |
| 5,038,307 | 8/1991 | Krishnakumar et al. | 364/578 |
| 5,163,016 | 11/1992 | Har'el et al. | 364/578 |
| 5,291,427 | 3/1994 | Loyer et al. | 364/578 |

OTHER PUBLICATIONS

Yu et al; "An Improved Method For Automatic Validation of Communication Protocols" IEEE 1990.
Chanson et al; "A Unified Approach To Protocol Test Sequence Generation"; IEEE 1993.
Chu et al; "Global State Graph Reduction Techniques For Protocol Validation In the EFSM Model"; IEEE 1989.
Wang et al; "Automatic Test Sequence Generation For Extended Finite State Machines", IEEE 1992.

Primary Examiner—Ellis B. Ramirez
Attorney, Agent, or Firm—Albert P. Cefalo; Barry N. Young

[57] ABSTRACT

A method for generating test programs for an implementation of a specification that has been modeled as an extended finite state machine (EFSM), the EFSM including vertices and transitions, where the transitions represent functions to be performed by the implementation, including predicates and actions such as variable assignments. The method includes traversing the EFSM in a depth-first manner from a root model start state to a root model exit state, through intermediate vertices which may be normal states or models. Models include further vertices and transitions, and may be called as submodels or as go-to models, where a go-to model includes an EFSM exit state. The EFSM may be traversed exhaustively, such that all possible paths are traversed, or in a partial transition coverage mode, where a user-defined subset of the possible paths are traversed. Each traversed path is stored in a path file and converted into a test program in a predetermined language, such as C, for interfacing with the implementation to be tested and testing its functions as represented by the transitions taken. Traversal of the EFSM is made possible by the use of a model stack, a path stack and a variables stack, which keep track of all models called, transitions and vertices encountered, and variable values assigned or altered in the course of the traversal, with cross-referencing to ensure that any desired set of path files can be automatically generated while tracking all parameters necessary to conduct the traversal.

5 Claims, 4 Drawing Sheets

METHOD AND APPARATUS FOR GENERATING TESTS FOR STRUCTURES EXPRESSED AS EXTENDED FINITE STATE MACHINES

BACKGROUND OF THE INVENTION

The present invention is directed to the area of software testing, in particular the testing of implementations of specifications therefor, where the specifications are expressed as multiple-model state-rich architectures. Specifications particularly suitable for modeling are software applications and physical systems running from alarm clocks to automatic teller machines to complex systems such as aircraft.

The use of finite state machines (FSMs) and extended finite state machines (EFSMs) for modeling real-life problems is known, as reflected in *The STATEMATE Approach to Complex Systems*, by i-Logix of Burlington, Massachusetts (1990); and D. Harel et al., *STATE-MATE: A Working Environment for the Development of Complex Reactive Systems*, IEEE Transactions on Software Engineering, Vol. 16, No. (Apr. 1990). See also W. H. Jessop et al., *Atlas—An Automated Software Testing System*, Bell Laboratories, Inc., 13th IEEE Computer Society International Conference, pp. 337–340 (1976) and 2nd International Conference on Software Engineering, pp. 629–635 (1976). Various test selection methods for systems expressed as finite state machines are discussed in S. Fujiwara et al., *Test Selection Based on Finite State Models*, IEEE Transactions on Software Engineering, Vol, 17, No. 6 (Jun. 1991) and W. H. Jessop et al.

EFSMs are also discussed at length in applicant's copending patent applications, as follows:

"Method and Apparatus for Testing Implementations of Software Specifications" (the "ISL Testing" application) Ser. No. 08/100,006, filed Jul. 29, 1993

"Method and Apparatus for Transforming a Specification into an Extended Finite State Machine" (the "ISL Transformation" application) Ser. No. 08/100,005, filed Jul. 29, 1993;

"Method and Apparatus for Schematic Routing" (the "STE Routing"application) Ser. No. 08/100,001, filed Jul. 29, 1993; and "Method and Apparatus for Schematic Panning" (the "STE Panning" application) Ser. No. 08/100,007, filed Jul. 29, 1993.

Each of the foregoing patent applications was filed with the United States Patent Office on Jul. 29, 1993, along with the present application, and each of the applications and articles cited above is incorporated herein by reference.

The Atlas system is described as modeling, for instance, part of a telephone switching system, and a coverage scheme is used to traverse the model, thereby deriving tests for the switching system. However, the Atlas system is directed to only a single model; that is, there is no provision for a second model to be called by the first model, in effect creating a submodel, nor for a model to recursively call itself. Only nonhierarchical flow is possible using a system like Atlas, and thus the systems which may be exhaustively modeled are limited. Traversal of a model (i.e. generating test paths through the model) can be carried out only at one level.

In addition, although the Atlas system outputs a graphical representation of the model, this representation is "dead"; i.e., it cannot be used to input or edit the model.

The STATEMATE system also uses connected graphs to represent models, but tests only the specification itself, and not the implementation of the modeled system.

No prior system known to applicant is capable of modeling the specification of a state-rich structure as an EFSM with multiple levels of models, and of generating tests of the EFSM against a specification to ensure that a planned implementation complies with the specification. Such a system is needed in the case of complex structures, which in the past have been traversed only as simplified, single-level (or "flat") models.

SUMMARY OF THE INVENTION

The present invention includes a computer system and software that enable a designer to create a specification for a system that can be expressed as an extended finite state machine (EFSM), wherein the functions of the system are modeled as states and transitions. It may be used to model systems and specifications that include control flow issues, where transitions represent the functions of the system and states represent decision points where the system is presented with the next transition or a set of alternative transitions. It may also be used to model systems that involve data flow problems, in which case the data relationships are first converted into EFSMs. Each generated EFSM is traversed to automatically generate validity tests for the design of the system, and can be edited as necessary to correct or otherwise alter the specification. The validity tests ensure that the implementation meets the requirements of the specification, by flagging paths that produce results at odds with the specification.

The specification is expressed as an architecture comprising multiple models, which are linked EFSMs, including submodels and recursively called models, where each model is itself an EFSM. The architecture thus represents several to many EFSMs linked together, wherein states within the architecture are themselves submodels, i.e. are themselves EFSMs. Traversal of the complex multiple-model architecture to generate tests of the implementation is accomplished by the use of context, which involves tracking the path history of the traversal by means of path stacks and model stacks, and by generating variables designed specifically for communicating between models at different levels.

The method of the invention provides a degree of automation which may be measured by the ratio of the amount of test information generated by the system to the amount that the user must provide. If the user had to provide all the test information manually (as when the EFSM is modeled directly), this would involve providing the test information for each transition in the model, and then the present invention would generate tests by traversing the model. (For data flow problems, the test information is generated automatically; see applicant's "ISL Testing" application mentioned above.) The degree of automation is the ratio of the total number of transitions taken in all the test paths generated to the total number of transitions in the model. This is generally a very large number, since traversal of an EFSM as described herein may produce millions of paths in the tests, even where only a couple of dozen of transitions were modeled by the user.

Table of Contents

Figure 2:
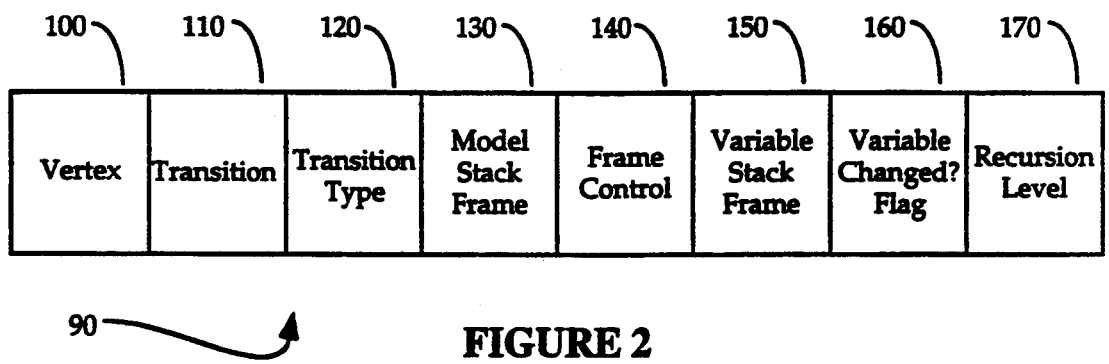
FIG. 2 is a diagram of a path stack frame used in the method of the invention.
Figure 3:
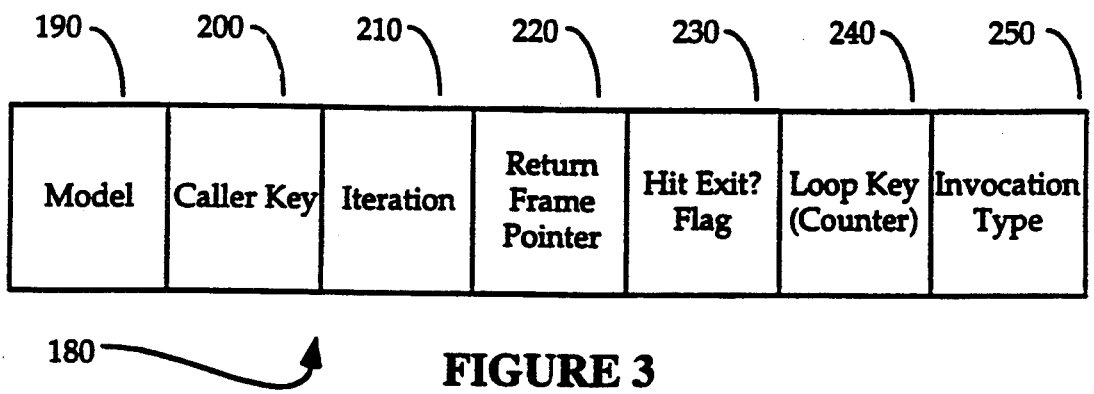
FIG. 3 is a diagram of a model stack frame used in the method of the invention.
Figure 4:
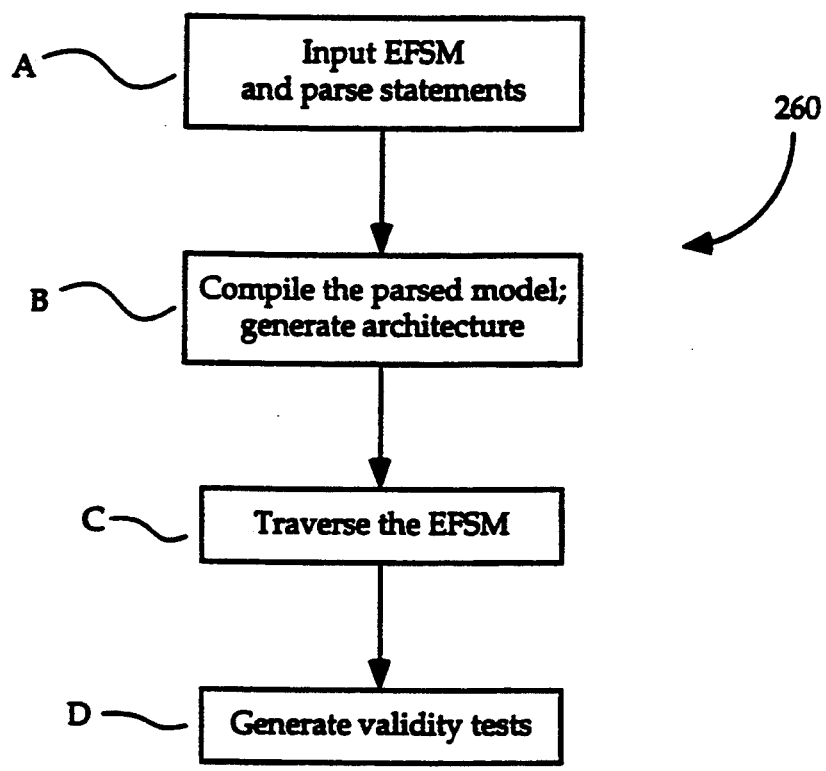
FIG. 4 is a flow chart of the overall method of the invention.

I. The apparatus of the invention
II. The Path Flow Language (PFL) for EFSM definition
   A. Terminology
   B. Creation of EFSMAs
      (1) Constraints
      (2) Test information
      (3) Model declaration
      (4) Variable types and classes
         (a) Variables types
         (b) Variable storage classes
      (6)
      (5) Arguments
      (6) Control code
   C. Linking EFSMA Models
   D. Context: Path Stack, Variables Stack and Model Stack
III. The Method of the Invention
   A. Input the EFSM, and parse statements
      Executable PFL: "PFLEXE"
   B. Compile the parsed EFSM; create linked architecture
   C. Traverse paths: execute the model
   D. Generate validity tests
      Pseudocode for the traversal method
IV. The "alarm" Architecture
   A. Function of the "alarm" model; reading the EFSMA diagrams
   B. Traversal of the "alarm" model.
      1. The stacks used in traversing.
      2. Following the trace printout of the traversal.
         a. Building up the variables stack.
         b. Generating the validation test from the path file.
         c. Backtracking the path file to generate alternate paths.
Appendices:

| Appendix | Contents |
|---|---|
| A | Backus-Naur Format (BNF) for PFL |
| B | State Transition Editor User's Guide |
| C | Examples for PFL |
| D | Pseudocode for the traversal method of the invention |
| E | Printout of test information of alarm clock model of FIGS. 2-4 |
| F | Trace printout of traversal of alarm clock model of FIGS. 2-4 |

DESCRIPTION OF THE PREFERRED EMBODIMENTS

The description of the invention makes reference to the appendices listed above.

I. The apparatus of the invention

Figure 1:
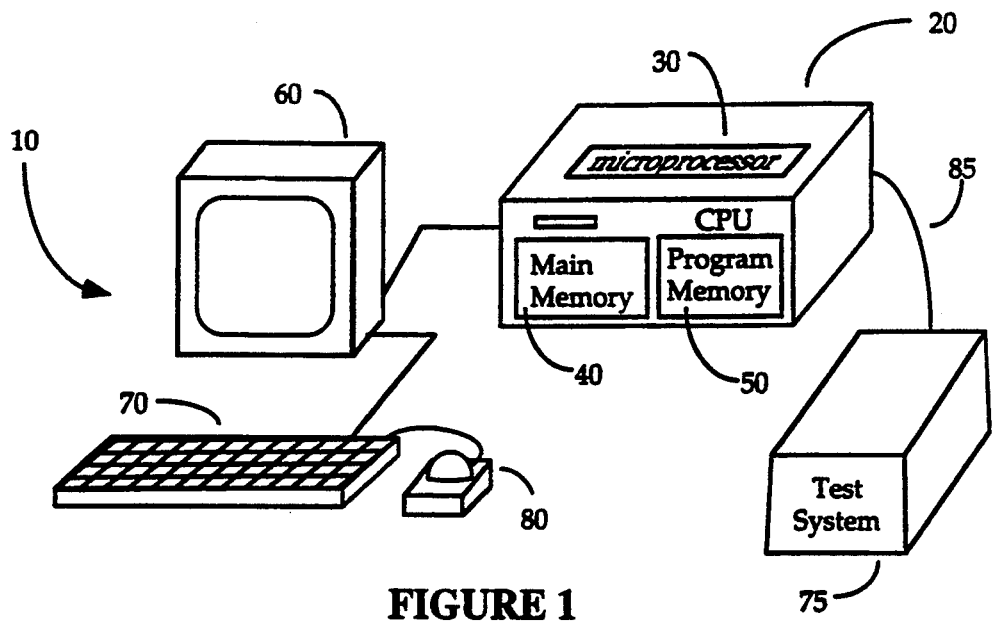
FIG. 1 is a diagram of an apparatus for implementing the present invention.

The invention is preferably implemented in a computer system such as system 10 depicted in FIG. 1. The system 10 includes a central processing unit (CPU) 20 including a microprocessor 30 coupled to main memory 40 and program memory (such as ROM or RAM) 50. Computer input and output may be displayed on a monitor 60 or other output device, such as a printer (not shown). User input is provided via a keyboard 70, a mouse or trackball 80, and other standard input devices.

The system 10 is conventional, and may be a microprocessor system, a workstation or networked terminal system, or any of a variety of other apparatus providing computing and input/output capabilities.

All of the method steps described below, except for the original creation of the specification whose implementations are to be tested, are carried out in the microprocessor 30. The implementations themselves are, of course, applications designed by programmers. Thus, the apparatus of FIG. 1 carries out all the steps of the invention automatically. Given the following detailed description of the method of the invention, it will be a routine matter for a programmer to produce code to carry out all of the described steps.

Test system 75 represents an implementation of a specification. It may be a software implementation of a software specification, a hardware implementation of a design specification for a hardware-implementable system, or a combination of hardware and software. Connection 85 represents an interface between the computer system 10 and the test system 75, and may in practice constitute software modules, hardware drivers implemented in software, robotic devices to manipulate hardware, or in short any apparatus and associated software needed to cause the test system to perform the functions set forth in its specification, so that the system of the present invention can determine whether those functions have been executed as prescribed.

II. The Path Flow Language (PFL) for EFSM definition

A. Terminology

In this application, the term "state" is used in the sense used in finite state machine literature. A state may be a simple start state, intermediate state or exit state, or an icon representing a model. A "model" is any state that has further states and transitions called by it, i.e. at a lower level than the calling level. Any state or model in the graphical and logical structures discussed herein may also be referred to as a "vertex", particularly to emphasize the position in the structure between transitions.

The overall EFSM is itself a model, and any models within it that link further states and transitions are thus submodels. A model (EFSM) that is not "flat", i.e. includes at least one submodel—and more typically, multiple (sub-)models,—will be referred to herein as an "architecture". Whenever an "EFSM architecture" (or "EFSMA") is referred to herein, it should be understood that the same procedure is applicable to a single EFSM model.

A "transition" is always a connector between two states. It may have any number of annotations to it, which include predicates that must be true if that transition is to be taken, actions that are executed when the transition is taken, test stimuli that drive the implementation through the transitions, and events leading to the taking of the transition. Transitions are also referred to as "edges", particularly when referring to the model diagrams in the figures.

To "execute" an EFSMA means the same as to "traverse" that EFSMA, i.e. carry out a traversal scheme, whether exhaustive or selective (allpaths or edge cover, discussed below), and as a result to generate one or more path files representing each path traversed from the start state to an exit state of the EFSMA. (There is only one start state, but there may be several exit states.) "Traverse" is also used in connection with taking a particular transition, or set of transitions, which may be less than an entire path through the EFSMA.

B. Creation of EFSMAs

In order create complex EFSMAs, including multiple models, and to traverse such complex EFSMAs to generate tests for an implementation of a specification, applicant has developed a new language to express the EFSMAs. The language is called Path Flow Language (PFL). The features of PFL are detailed in Chapter 2, "Programming in Path Flow Language (PFL)", Appendix B which is incorporated by reference. Appendix A is the Backus-Naur Format (BNF) for PFL, describing the syntax of the language which is incorporated by reference.

PFL expression notation is modeled after the C language. PFL expression operators, associativity, and the logical, relational, equivalence, arithmetic, multiplicative, and unary expressions, for instance, are analogous to features in C. Operands (variables and constants) in PFL can be any named data types as described in Appendix B (STE User's Guide) (given the specified data types and operators).

Using Appendices A and B, it is straightforward to produce the code necessary to implement a language to define a multiple-model EFSMA to be traversed as described in Section III below. Functions used by PFL or its equivalent should provide the ability to define data-rich or state-rich specifications as EFSMAs. An EFSMA (extended finite state machine) as used by applicant differs from a conventional finite state machine by introducing "context", and by extending the definition of "transition" to include context update and context evaluation when taking transitions.

Once a model is created, it may be used multiple times in different parts of the EFSMA, as will be seen with the "RingBell2" submodel shown in FIGS. 5–7 and discussed in Section IV below.

This greatly reduces the number of states necessary to express a complex system, since such a multiple-model EFSMA may be three-dimensional; i.e., any state may in fact be a submodel with its own structure below the top level of the EFSMA. Without the context-related functions, every model would be flat, and repeated calls to the same submodel would need to be expressed linearly; recursive calls to a submodel would not be possible. Basing current flow on prior actions, then, provides a powerful tool for greatly increasing the complexity of a system expressible by the EFSMA, but not the complexity of the graphical model.

Elements of an EFSM as used herein include:
a declaration section including the name of the model, formal parameters and internal variables. These include calling parameters and local, externally referenced and scoped variables, which are defined below.

machine states. A given state may be an ENTRY state, an EXIT state, or an OTHER type of state, namely an normal (non-model) state.

transitions: mapping between states (a function of current state, current input and current context), resulting in the next state, next action and next context only if the value of an associated predicate for the transition is TRUE.

events: control or data inputs that drive the machine, each associated with a transition.

variables used to store and restore context.

actions: assignments to variables or model invocation; also associated with transitions.

context: valid values of all variables at each transition, including states, transitions, events, models and threads in a given current partial path.

outputs: referencing work done by implementation and PFL primitives to update the context.

predicates: Boolean-valued functions used to evaluate context.

The output of the invention, comprising a set of tests, is generated by executing (traversing) the EFSMA. Although EFSMAs have until now not been designed to be executed, PFL provides the necessary elements for doing so. These include the following:

(1) Constraints, which are PFL expressions used to set boundary conditions, to limit numbers of cycles (loops) executed and recursions called, to select subsets of tests for execution, to set boundary conditions, and to select or deselect particular paths for execution.

(2) Test information, which is user-supplied or internally generated (i.e. the "user" may be a compiler) information required to simulate and verify actions of the system which are carried out in taking a transition. For data flow problems, for example, the test information would be the value of one or more items of assignments to set up data values. For state-rich (control flow) problems, the test information would be a set of statements from a test execution language pertinent to the problem at hand.

As an example, when a compiler is to be tested, the tests generated by the present invention are actual programs that are to be compiled; the tests include language statements for the compiler. If the system being tested is a graphical user interface, the test language comprises a series of statements representing mouse or track ball and keyboard inputs, as well as verification that the window or screen state has altered as expected.

In either case, assignment expressions are annotated to transitions of the EFSMA, and logical expressions are used to evaluate predicates on the transitions.

(3) Model declaration, including the model name, formal parameters and internal variables used by the EFSMA. (Simple variable names are provided for the user interface.) Internal names are strings which will be referred to as "identifiers", and which are unique for each given object.

Identifiers are used to describe graph objects including states, models, transitions, events and variables. A given identifier will typically include data type, storage class, parent model, iteration, and name or thread id. These concepts will become clear in the discussion of the method in Section 3 below. The BNF for the formation of these identifiers appears at the beginning of Appendix A.

(4) Variable types and classes.
  (a) Variables types in PFL include:
    1. number: floating point
    2. string: ASCII character string
    3. group: a collection of heterogeneous EFSMA elements (models, states, transitions or events), with no ordering implied.
  Both union and intersection relationships among group elements are expressible.
    4. flow: a sequence of EFSMA elements. Each element of the sequence either "leads directly to" or "leads to" (not necessarily directly) the next element. The "leads to" flow type allows other elements to come in the path between the two specified element, whereas the "leads directly to" does not.
  (b) Variable storage classes in PFL include:
    1. local: scope (i.e. realm of validity) includes only the declaring model.
    2. scope: scope includes the declaring model and any model encountered later in the path that has a variable of the same name, where that variable is declared as "external".
    3. extern (external): scope includes only the declaring model; but the linkage is to a previous model in the path that has a variable of the same name, where that variable is declared as "scope".
    4. parameter: scope includes only the declaring model; values are passed by the calling model.
(5) Arguments: associated with a calling model and mapped to the formal parameters of the calling model, as one mechanism for passing data between models.
(6) Control code: source code may be annotated on transitions to generate the control code of the application (or other implementation of the specification). PFL variables are described in detail in Appendix B, Chapter 2.3. The building blocks of these variables include: numbers, strings, events, transitions, models, states, and threads. Numbers and strings take on a variety of values during path execution. Events, transitions, models, states and threads are Boolean-valued, i.e. whether they exist or do not exist in a given partial path. The use of these building blocks is illustrated in the example in Section IV below.

"Group" variables

The "group" type of variable mentioned above denotes a collection of heterogeneous graph elements, namely events, transitions, states and threads. There are two types of groups:
  AND groups: where every element (point) in the group is in the current path (the value is "true" is all elements are in the path)
  OR groups: where any element of the group is in the current path (i.e., the value is "true" if any element is in the path)

"Flow" variables

The "flow" type of variable is a collection of these same graph elements, with a specific order implied. See Appendix B, page 2-7. If only one graph object is stated, it is a flow of one, and must be in the current partial path. There are two flow operators, as indicated above:
  LEADS TO: one graph object leads to another. E.g., "state_x LEADS TO transition_y" means that state_x must come somewhere in the current path before transition_y. There may be intervening objects.
  DIRECTLY LEADS TO: one graph object leads directly to another, without any intervening objects.

An example of the flow type of variable is discussed in Section IV below.

C. Linking EFSMA Models

The PFL of the invention provides a mechanism for linking EFSMA models together into a larger "super" model or architecture. Models may be connected in one of three ways:
  1. in a sequence, where a state in one model links into the entry state of another model.
  2. using submodels, where one model invokes another. When the procedure exits the invoked model is exited, it reenters the calling model to continue the current test path.
  3. concurrently, where one model can create another model, and both are executed simultaneously.

To be expressed as an EFSMA in PFL or an equivalent, and then to traverse the EFSMA to generate validity tests, certain basic requirements must be met. The model must, first, contain a finite number of states, or traversal can never be complete. If this criterion is not met, then at least the portion to be traversed must be finite. On the other hand, the model may be infinitely recursive; this is allowable as long as a constraint or predicate is placed on the recursion to prevent the procedure from attempting to traverse without end.

The modeled system may be nondeterministic. Thus, given an event, a state and a context, many predicates in the system can evaluate to true. However, for testing purposes, determinism must be enforceable by test primitives, such as by inhibiting certain internal actions of the implementation.

Any number of cycles may be supported by PFL, a cycle being defined as a test path where the same state is encountered more than once for a given model invocation.

Any number of model recursions may also be supported. Thus, a given path within an invoked model may itself include an invocation of the model. This is an important feature in defining a multi-dimensional EFSMA.

D. Context: Path Stack, Variables Stack and Model Stack

A feature of the invention that allows the traversal of complex multimodel architectures is the use of context. Context is maintained by path stacks and model stacks, which are stored internally and constantly updated as a model is traversed. The fields of these stacks are defined as follows; their use will be explained by example in Section IV below.

Path Stack and Variables Stack

The path stack includes a stack of frames having the format shown in FIG. 2. Path stack frame 90 has seven fields 100-170, including vertex field 100, transition field 110, transition type 120, model stack frame field 130, frame control field 140, variables stack frame field 150, a field 160 to flag whether there has been a variable change, and a recursion level field 170.

Field 100 (vertex field) identifies the model in which the process is currently in at any given time, or state from which it has come. The vertex (which may be a state, a model, or a submodel) is stored as a vertex object in an internal, conventional symbol table for PFL. See section III.C below. The vertex table contains all the data related to each vertex.

Field 110 (transition field) points to a transition object in an in-core symbol table for the transitions, and contains all data related to the current transition.

Field 120 (transition type) identifies the type of the current transition.

Three types of transitions are possible:
  (1) Normal (N): a transition from one state to another in the same model.
  (2) Inbound (I): transition from a state in one model to the entry state in another. An inbound transition is created when a state (of any type) has a transition to a model.
  (3) Outbound (O): a transition from an exit state of one model to the state which represents the call to that model. An outbound transition is created whenever a submodel relationship is created.

Field 130 (model stack frame) refers to the model stack frame which was current when the transition was taken.

Field 140 (frame control) is used by the used by: (1) an "allpaths" coverage scheme to determine when a vertex in a given path stack frame has been exhausted; or by (2) an "edge cover" coverage scheme to select the next edge to traverse. In the allpaths mode, this field includes a link count, i.e. a count of the transitions that have been traversed from the current state. If edge cover is being used, this field contains a hit mask, which is a mask showing which of the allowed transitions for the current initial state have been taken. Link count and the hit mask thus fill similar functions: both inform the coverage scheme which of the transitions that are to be taken from a given vertex remain to be traversed. Hit mask represents a non-ordered list of choices, whereas the link count represents an ordered list of choices.

Field 150 (variables stack frame) refers to a variables stack, stored in memory, which is constantly updated to store each set of variables at each transition where at least one variable changes, or alternatively to store only the changed variables. It is used to restore variables to their previous values when "backing up" the paths to traverse different paths, as described in detail in Section IV.B.2 below.

Field 150 is important in the saving of context for executing the EFSMA. Context of the EFSMA includes information as to states, transitions, events and variables. All PFL statements relating to predicates, constraints and actions refer to and/or set context of the system. In addition, as a model is traversed, context must be saved, and restored as necessary, to generate correct paths.

The values of states, transitions and events are derived at any point in a path by scanning the model and path stacks to a specific point. These elements of context are therefore implicitly maintained by the stack operations. As noted above, the value of the variables must be saved each time they are changed (so they can be restored when a transition is "popped", i.e. retraced to follow a different path). Thus, the variables stack frame 150, not explicitly shown in the printouts, refers to those saved variables.

Field 160 includes a flag indicating whether a variable has changed. If so, then when popping the stack to retrace a path (in order to traverse another path), the variable(s) must be restored when a frame including this flag (in a set mode) is encountered. This can be done either by restoring only the changed variable(s), or by restoring all of the variable values whenever any of them is changed. The latter approach is easier to implement but not as conservative of memory or cycles necessary to restore variables.

Field 170 (recursion level): if a model is encountered and that model is already in the path and has not yet reached an exit state, the model is recursing. This field indicates the level of recursion. It is used only if more than one model recurses.

Model Stack

The model stack includes a stack of frames having the format of frame 180 shown in FIG. 3. Model stack frame 180 includes seven fields: model field 190, caller key field 200, iteration field 210, return frame pointer field 220, a field 230 for a flag indicating whether an exit has been encountered for the given path, a loop key field 240 for counting loop iterations, and a field 250 indicating the type of invocation for the current model.

The system includes a model table, which includes one entry for each unique model in the system, including information related to the stored symbol table and data unique to the model. The model field 190 indicates, for a given point in a path being traversed, which model the path is in at that point.

The caller key field 200 indicates which model called the model which the path currently is in.

The iteration field 210 indicates the depth of iteration (or call level) of the current model is currently being processed. The depth of the iteration is not necessarily equivalent to the number of entries in it; for instance, submodel relationships that complete prior to another model invocation do not affect call level.

The return frame pointer field 220 indicates to which frame of the model stack the path will return to when a submodel is exited.

The flag of field 230 indicates whether an exit has been encountered in the path currently being processed.

The counter of field 240 indicates how many times a given loop has been traversed in the current path.

The invocation type of field 250 identifies in what manner the current model was called; a given model may, for instance, be called as a GOTO model or as a SUBMODEL. Other possibilities are ROOT and THREAD.

III. The Method of the Invention

The overall method of the invention is represented in the flow chart 260 shown in FIG. 4. There are four basic stages to the method:
  A. Input the model (EFSMA) and parse statements
  B. Compile the parsed EFSMA, and use the compiled EFSMA to generate links between models via model invocation statements, and to create lists and stacks as described below.
  C. Execute the EFSMA, i.e. traverse it in a coverage scheme (allpaths or transition cover, generating path files).
  D. Generate validity tests from the path files.

Stage A. Input the EFSMA, and parse statements

The input to the apparatus of FIG. 1, which stores software necessary to carry out the method of the invention, is an EFSMA. This is a representation of the input architecture, but not yet including the functional links that are generated at compile time (see Section III.B below).

Input also includes PFL statements as discussed above, which are parsed as they are input (or upon being stored). The statements are converted into postfix notation, and the parsed input is stored in a transaction-oriented database. The result of this procedure is to produce a symbol table containing variable allocation, executable statements, etc. The input and parsing steps are guided by the description of PFL above and in Appendices A and B.

The EFSMA (or model) may be input by one of a several means, such as by a graphical user interface, by means of an API, or by means of a command line interface. Thus, it may be input directly, or generated automatically (generating PFL). As discussed in the Background of the Invention, EFSMAs are used in certain prior art systems In the case of an application programming interface (API) or a command line interface, the model is hand-generated (graphically or textually). It may alternatively be automatically generated from a specification expressed in a given language such as applicant's Interface Specification Language (ISL), as described in applicant's copending. Another manner of generating an EFSMA is by visual programming using applicant's graphical user interface, called State Transition Editor (STE), the manual for which appears in Appendix A, and which is fully discussed in applicant's aforementioned "ISL Testing" application.

Whichever of these methods is used to input the EFSMA, it is ultimately expressed in PFL. The details necessary to determine how to do this are set forth in Chapter 2, "Programming in Path Flow Language (PFL)", Appendix B which is incorporated by reference. Appendix A, the BNF for PFL, gives the syntax for expressing PFL statements. See Section II above. (A language equivalent to PFL can be created and used to express EFSMAs for traversal according to the invention as described in Section III.E below, as long as the language provides the necessary features to traverse a multiple-model architecture, notably context.)

Figure 5:
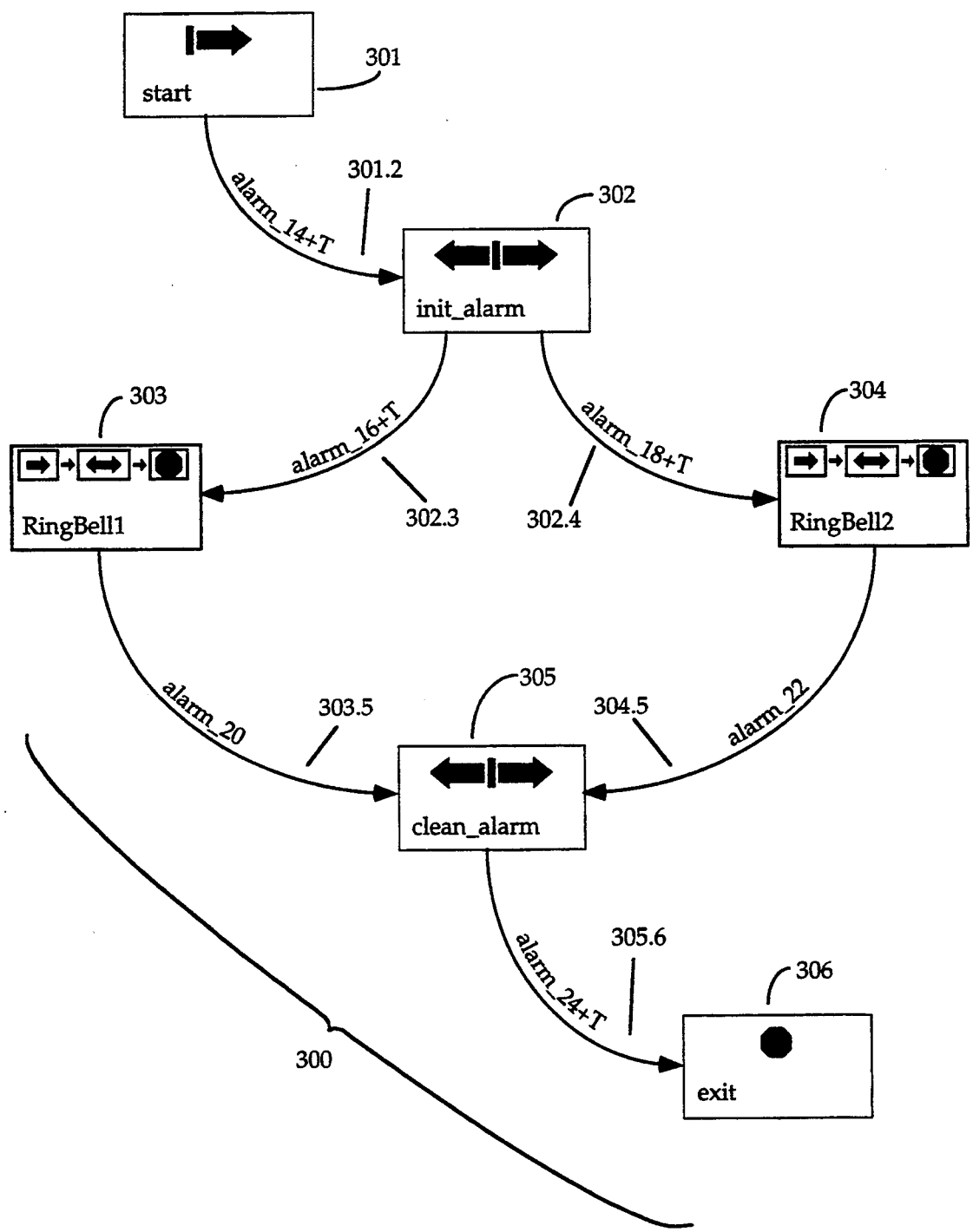
FIG. 5 is a state diagram of an example structure modeled by the present invention.
Figure 6:
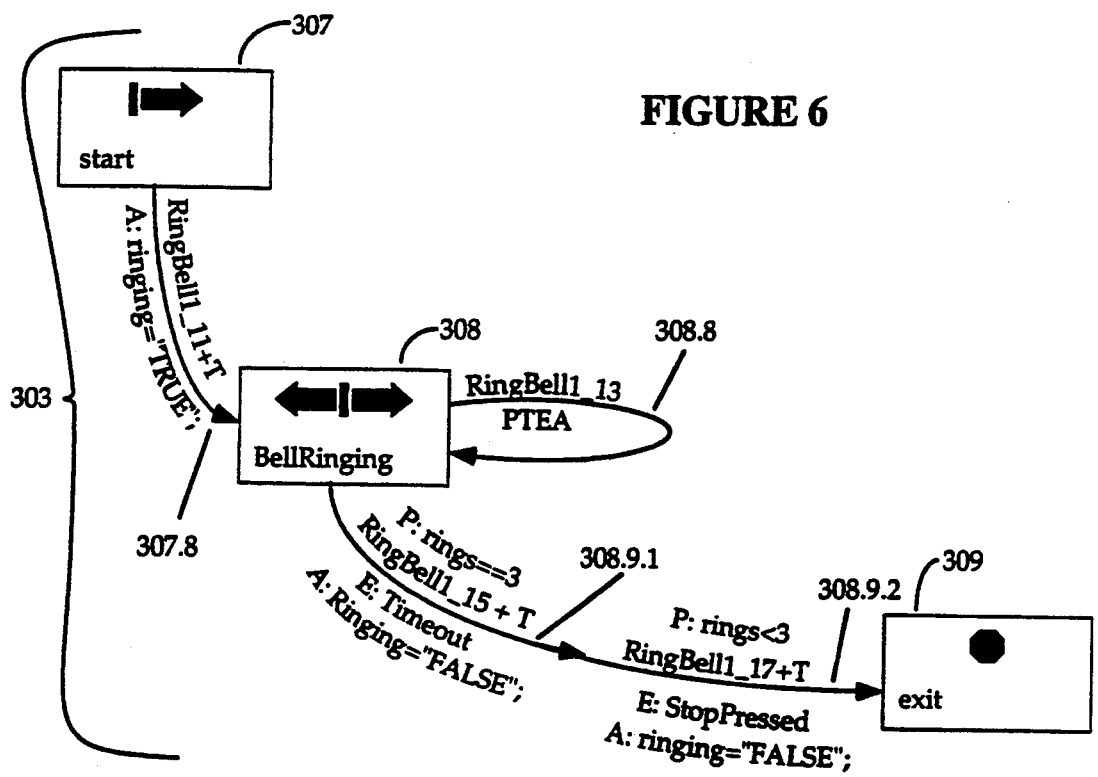
FIGS. 6–7 are submodels of the model shown in FIG. 2.
Figure 7:
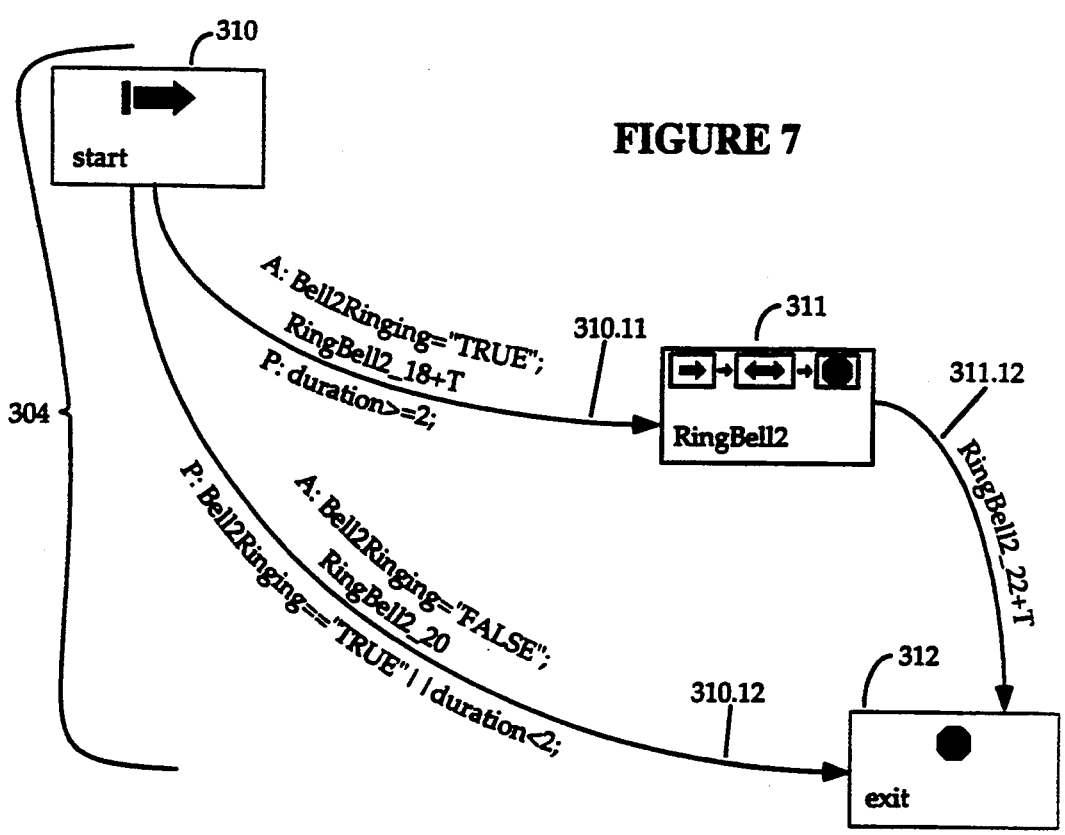

An example of a completed EFSMA (this one created by STE) appears in FIG. 5, and includes submodels as shown in FIGS. 6 and 7. This example is discussed thoroughly in Section IV below.

Any PFL statements (such as predicates, assignments, etc.) are parsed as they are entered, with error detection being provided immediately after the user saves the PFL statements. The tools used to process PFL during the front-end phase are a lexical analyzer and a parser.

The lexical analyzer may be a conventional analyzer such as "lex", as described in "Lex—A Lexical Analyzer Generator" by M. E. Lesk and E. Schmidt of Bell Laboratories in Murray Hill, New Jersey. See also SCO UNIX® System V/386 Development System Programmer's Guide (especially Chapter 2: An Overview of lex Programming), by The Santa Cruz Operation, Inc. (SCO PH: 014-036-900). The foregoing works are incorporated herein by reference.

The lexical analyzer scans text and recognizes keywords referred to as "tokens". The lexical analyzer knows the valid components of each token, i.e. whether it should consist of alphabet characters, numbers, upper/lower case, special characters and the ordering and frequency of each token element.

Once the lexical analyzer recognizes a token, the analyzer passes the token to the parser. The parser understands the order that the tokens must appear, these rules are called productions. The parser may be one generated in a standard fashion by YACC, which is a conventional parser generator, whose use in connection with lex is described in the SCO UNIX reference cited above.

If the parser encounters input that is not syntactically correct, an error message is displayed, with enough information for the user to correct the syntax of the statement.

After text is scanned and parsed, it is not useful to repeat this operation for a second time, that is, at run-time. It is more expedient to turn the text into an entity that the computer can easily process for execution. For PFL, this notation is postfix, which is a conventional means of expression statements, and is also known as "reverse Polish notation". Thus, the input to the parser is text, the output is in postfix notation. See R. E. Berry, "Programming Language Translation", (England, Ellis Horwood Limited, 1982), incorporated herein by reference, especially at pages 56–59.

Postfix notation is a simple way to format statements so as to execute them using a stack as a data structure. All PFL statements have counterpart postfix notation that is saved with database files on disk. A brief example follows for illustration:

The user enters: x=(a+b)* c (The order of evaluation here is addition, then multiplication, then assignment.)

The resultant postfix string is: xab+c*=
The complete postfix line is: 6x6a6b4+6c4*4=110
In the complete postfix line, the enumerated types are:

| | |
|---|---|
| 6 | variable |
| 4 | operator |
| 11 | end-of-statement |
| 0 | end-of-file |

Other postfix operators are used for parsing PFL, and are described in Appendix C attached hereto. For reference, the following table lists a set of standard postfix codes:

TABLE 1

| symbols embedded in postfix PFL | |
|---|---|
| PPCEND | 0 - end of expression |
| PPCGROUP | 1 - group |
| PPCSUBPATH | 2 - subpath |
| PPCNUM | 3 - literal number |
| PPCFUNC | 4 - function |
| PPCNONE | 5 - semicolon |
| PPCNONLIT | 6 - non-literal |
| PPCCRANGE | 7 - continuous range |
| PPCDRANGE | 8 - discrete range |
| PPCSTRING | 9 - string |
| PPCSEQEXP | 10 - sequence expression |
| PPCOMMA | 11 - comma operator |

TABLE 2

| Postfix function definitions | | |
|---|---|---|
| TADD | 0 | + |
| TSUBTRACT | 1 | − |
| TLESSTHAN | 2 | < |
| TLESSTHANEQ | 3 | <= |
| TGREATERTHAN | 4 | > |
| TGREATERTHANEQ | 5 | >= |
| TEQUIV | 6 | == |
| TNEQUIV | 7 | != |
| TDIVIDE | 8 | / |
| TMULTIPLY | 9 | * |
| TEQUAL | 10 | = |
| TNOT | 11 | ! |
| TAND | 12 | && |

TABLE 2-continued

| Postfix function definitions | | |
|---|---|---|
| TOR | 13 | \|\| |
| TIF | 14 | if |
| TLIMIT | 19 | iterate |

The postfix notation is read from left to right, and each element is interpreted in context. From each element of the complete postfix line string a data structure is built, which may be referred to as a PFLEXE, i.e. a PFL-executable structure. Once the PFLEXE structures are formatted for every declaration, argument, predicate, constraint and action on every transition, pure path execution may begin.

Executable PFL: "PFLEXE"

PFL expressions are converted from the ASCII postfix format to an executable format in order to provide efficiency by eliminating the need to "lookup" objects while executing traversal algorithms.

Each PFL executable structure (PFLEXE) specifies either an operand or a function (operator). A PFL expression in its executable format is a list of PFLEXEs, e.g. [P1][P2] . . . [Pn], where P1–Pn−1 are operands and functions, and Pn indicates the end of the expression. The expression in this format can be executed using the following procedure:

```
do{
    case PFLEXE.type
        operand:
            push (PFLEXE)
        function:
            n=order of function (number of arguments)
            pop n PFLEXEs off the stack
            call function with n PFLEXEs
            push result onto the stack
        eof:
            pop the last PFLEXE off the stack
            value of expression is the value of this PFLEXE
}while(PFLEXE=PFLEXE->next)
```

PFLEXE operands are one of the PFL data types, namely:
Number
String
Vertex
Transition
Range
Event
Model
Flow (SequenceExpression)
Group PFLEXEs representing graph objects contain:
a pointer to the symbol table entry for the model the object is in
a pointer to the symbol table entry for the object itself
the specified model iteration
the specified object iteration The object names are looked up just once-at the start of the path traversal algorithm. Each time a graph object is referenced during execution, it is searched for on the path stack, the model stack or both using pointer comparisons. PFLEXEs representing literals contain the value of the literal. PLFEXEs representing functions contain an index into the function table in which there is an entry for each of the PFL operators (+ − =, etc. ). Each entry in the table contains the order of the function as well as a pointer to the function itself. This pointer is used by the stack algorithm mentioned above to make an indirect function call and execute the specified function. As an illustration of how PFLEXE is generated, consider the internal PFL identifier expression

*. RingBell.*.NUMBER.LOCAL.rings<=2;

The left side of this expression is a variable string which can be interpreted using the BNF for PFL in Appendix A. Referring to page A-1, the thread-id is * (see page A-2 for thread-id format). The model-id is in the form identifier.iteration (see page A-2), here taking the form RingBell.*. The data-type-specifier is NUMBER (see page A-2 for the four possible types of data-type-specifiers). The specifier-type is LOCAL, and the identifier is "rings". This is the entire internal name for the variable, which would normally be referred to as variable "rings" .

The above expression is a test for whether "rings" is less than or equal to 2. The PFLEXE for this expression would be as follows:

| [0] | type = PFL_NUMBER<br>storage_class = LOCAL<br>object = pointer to symbol table entry for "rings" |
|---|---|
| [1] | type = PFL_NUMBER<br>storage_class = PFL_LITERAL<br>value = 2.0 |
| [2] | type = PFL_FUNCTION<br>function_table_index = TLESSTHANEQ (3) |
| [3] | type = PFL_EOF |

This represents an executable equivalent to the test expression given above; and all statements are expressed similarly. The exact format selected for creating such expressions is not crucial; the important factor is that they be executable.

Postfix lines for the "alarm" mode]of FIGS. 5–7 appear in Appendix E, and are discussed in Section IV below.

Stage B. Compile the parsed EFSMA; create linked architecture

The EFSMA is compiled by traversing it, starting at the start state of the root mode, compiling each as-yet-uncompiled model as it is encountered. The compilation itself is conventional, except that provision is made for the presence of multiple models in the architecture by recursively calling the compilation procedure. Thus, compilation begins at the root model, and when another model is encountered (i.e. when traversing a given transition in the root model leads to a submodel), compilation begins anew on that submodel. When compilation on the submodel is complete, compilation on the root model continues until another submodel is reached, and then compilation of that submodel begins. A submodel called by another submodel is itself called by a (second-level) recursive call of the compilation procedure.

In the compilation procedure, individual models are linked together by the transitions connecting them and the annotations to those transitions. At any EFSMA level, declarations of "scope" variables can be made, which can then be declared as "extern" variables in lower-level submodels; this effectively creates global variables for the EFSMA level at which a given "scope" declaration is made (and all lower levels).

Another method for data exchange across models in an architecture is parameter- and argument-linking. During execution, dynamic values of argument are passed into called models. Local variables may, of course, also be used. The use of context provides functional linking among the models and submodels, and between the EFSMA and all of its states and submodels.

Both scope- and extern-variables and parameter- and argument-linking are carried out by means of the annotations to the transitions, thus creating the necessary links between models in the EFSMA. Traversal of a transition leading to a submodel involves executing PFL statements constituting such annotations, i.e. setting up code to resolve "extern" variables or to resolve parameters and arguments needed for the submodel.

Stage C. Traverse paths: execute the model

The model is now in the form of an architecture typically including several to many submodels, and is ready to execute. The all-inclusive model is called the "root" model, where execution begins. The output of execution is a set of validation tests that start at the entry state of the root model, traverse a valid path through the architecture, and terminate at an exit state of the root model. (More than one exit state may be present.)

There are two types of coverage schemes, providing different degrees of error detection, meeting the requirements of "exhaustive testing", "thorough testing" and "identification testing" as defined in *IEEE Std 1003.3-1991/IEEE Standard for Information Technology—Test Methods for Measuring Conformance to POSIX* (1991). See also Chow, T., *Testing Software Design Modeled by Finite-State Machines*, IEEE Transactions on Software Engineering, Vol. 4, No. 3, May 1978. These two references are incorporated herein by reference. In STE and ISL parlance, exhaustive testing may be referred to as "allpaths", and thorough testing or identification testing as "edge cover" or "transition cover". In the latter types of testing, subset of tests from the exhaustive set of tests may be selected for generation.

A mechanism for selecting a subset of paths to be traversed according to a test purpose is also provided. A user may choose to select paths that traverse a specific state, transition, event or model. In this way, the resultant tests may be targeted to exercise a specific feature or problem area.

A given path through an EFSMA represents a unique combination of transitions. For example, traversing a path representing a unique test case of an API call produces values for the API parameters as well as executable code, these values and code corresponding to those relationships. The path traversal also produces calls to "hooks", discussed below, created by the user for testing the implementation.

As the model is executed according to a specific coverage scheme (allpaths or edge cover), PFL is executed to control the direction of path flow and generation. PFL statements are associated with points in a path; as the path generator attempts to traverse a point with one or more associated PFL statements (predicates, assignments, constraints, etc.), the statements are executed.

For small EFSMAs, i.e. those with relatively few paths (from several to several thousand), exhaustive testing is preferable, since the program is comprehensively tested for all possible combinations of variable values, etc. However, a complicated specification may have very large numbers of possible combinations of variable values or other parameters, and hence very large numbers of possible paths through the resultant EFSMA. For instance, if there are fourteen variables, each with ten possible values, there are at least $10^{14}$, or 100 trillion, possible paths through the EFSMA. This is an unwieldy number of paths to generate, and would consume an enormous amount of computer time, both to generate the paths and to run the resultant tests. Even greater numbers are possible where loops are created with large numbers of iterations. Where a routine is recursive and there are no internal limitation on the number of times it may call itself, the number of paths may in fact be infinite.

To avoid such situations, execution constraints may be placed on the process of generating paths. Thus, if a loop exists with a large possible number of iterations, the user may specify a constraint for that loop of, say, three iterations, so that values for variables generated in the loop may be tested, without testing every possible iteration of the loop.

Similarly, means are provided for flagging unconstrained recursions. During execution of the path generation program, any path with an unlimited recursive call would be identified, and either no paths would be generated including that recursion, or a limited number of recursions (perhaps one or two) may be executed, so that at least some paths are generated which include the recursive call.

The result of the path traversal stage is a set of path files. For allpaths (exhaustive testing), all paths through the EFSMA will be traversed, and one path file will be generated for each of these paths. For edge cover (thorough testing), one path file will be generated for each path actually traversed, which will be fewer than the total number of possible paths. Each validity test produced is derived from a single path through the EFSMA. If there are, for instance, fourteen paths generated through the EFSMA, then there are fourteen path files (giving fourteen validity tests) for testing the actual program to determine whether, in each case, it complies with the specification.

Pseudocode for the traversal method

Appendix D is a pseudocode listing of the method for executing (traversing) a multiple-model architecture of the invention. It will be discussed in detail in connection with the alarm clock example of FIGS. 5–7. The pseudocode is written for the allpaths (exhaustive testing) coverage scheme. Variations used for edge cover (thorough testing) are shown between square brackets. The core of this traversal method is in steps #3 and #4, where the transitions are traversed and the stack manipulations are carried out. The details of the execution of the method are brought out in Section IV.

IV. The "alarm" Architecture

The "alarm" architecture 300 shown in FIG. 5 depicts an EFSMA including six states (vertices) on the top level, connected by six transitions. The EFSMA 300 is a model of a small portion of an alarm clock, which could be implemented either as a free-standing physical clock or in software as a clock in a computer. The functionality would be the same in either case, and thus specification for either type of clock would be the same. Thus, the tests to be generated by traversing EFSMA 300 will be valid for any implementation of the model.

The modeled portion of the alarm clock in this case is kept deliberately simple, in order to minimize the number of paths generated and the number of steps taken in generating them. These steps appear in the trace printout of Appendix F; it will be seen that even for this simple model, five paths were traversed in over 200 steps. This model is sufficient to demonstrate the method of the invention.

The "alarm" root model 300 and the submodels RingBell1 and RingBell2 (in FIGS. 5-7) were in this case created using applicant's State Transition Editor (STE), mentioned in Section III.A above. This involves manually creating each state, connecting states by transitions, and annotating the transitions with predicates, actions, constraints, and test information to create the complete model. In the following discussion, then, the annotations to the transitions were deliberately placed there. For instance, there is a predicate along transition 308.9.1 in FIG. 6, "P : rings==3", which requires that the variable "rings" have the value 3 in order for that transition to be traversed. This and other features of the model will be explained in the discussion of the traversal of "alarm".

A. Function of the "alarm" model; reading the EFSMA diagrams

The EFSMA 300 includes a start state 310, and init_alarm (initiate alarm) state 302, a RingBell1 state (which itself is a model, specifically a submodel) 303, a RingBell2 state (also a submodel) 304, a clean_alarm state 305, and an exit state 306. The RingBell1 model itself has three states, shown in FIG. 6: a start state 307, a BellRinging state 308, and an exit state 309. The RingBell2 model also has three states: a start state 310, a recursive occurrence of the RingBell2 model itself at 311, and an exit state 312.

The alarm clock modeled in FIG. 5 has only two fundamental functions, each represented by a submodel:

(1) to ring at 8 o'clock (RingBell1" submodel), until a timeout after three iterations or until the alarm shutoff button is pressed; and (2) to ring at 2 o'clock ("RingBell2" submodel), for a maximum duration of two iterations.

These functions are illustrated by following each of the possible paths through the model 300. Beginning with the start state 301, one proceeds along the only available transition, namely transition 301.2. (This is identified in FIG. 5 as "alarm_14", which is an internal identifier simply indicating that this transition was the fourteenth object created in the model "alarm", when the model was built using STE.) The "+T" adjacent the edge identifier "alarm_14" indicates that there is test information associated with this edge. This test information is stored internally in the system's symbol table when the model is parsed as described above, and for reference here is listed in Appendix E.

The test information associated with edge 301.2 is thus found in Appendix E, page 1 under the heading "Edge alarm_14 [start→init_alarm]", and includes the following:

```
#include <stdio.h>
#include "alarm.h"
main( )
{
```

The conventional "include" statements will be understood by any C programmer, as will that fact that the second "include" statement references a header file created for this particular model, to take initial necessary actions such as declaring and initializing variables. The "main ( )" entry merely begins the main code of the validity test code that will ultimately be generated for each path file, upon traversal of the model.

At state 302 (init_alarm), two transitions are presented. (No action is taken at the state itself; it is an indicator of the condition of the state machine, and does not include test data, actions, predicates or the like.) These two transitions are 302.3 and 302.4. The first of these goes to state 303, which is the RingBell1 submodel, and the second goes to state 304, the RingBell2 submodel. There is a "+T" on each of the two transitions, which are identified in Appendix E, page 1 as forcing the time to 8 o'clock and 2 o'clock, respectively.

The point of this "force" is that the model is designed to test a real-life clock (with hooks for access by the test program), and the clock is supposed to ring in a predefined manner at 2 o'clock and at 8 o'clock. To verify the real-life clock's behavior, the test here must force the clock to take on these values, so as to verify whether the alarm rings when that occurs, and for the right time, and so on.

Thus, in practice the user of the system must write the correct routines to cause the implementation (whether it is a clock, or a spreadsheet program with mouse clicks and formula definitions, or a flight simulator with display graphics, and so on) to actually go through the actions needed to be tested, and to verify whether the response of the implementation is as specified. If it is not, the validity test should verify where the failure(s) occurred.

Accordingly, edge 302.3 includes the test data that the time is forced to 8 o'clock, and the comment that in RingBell1, the alarm is supposed to ring until a "time-out" or until the (shutoff) button is pressed. Edge 302.4 includes the test data that the time is forced to 2 o'clock, and the comment that in this case the bell should ring until a preset duration elapses.

Referring first to RingBell1, the submodel diagram is shown in FIG. 6. When a submodel is called, the first step is always to enter at the submoders "start" state, in this case state 307. Taking transition 307.8, there is a test annotation, indicated by the "+T", which is identified under "Edge RingBell1_11" in Appendix E, page 2 as:

Verify (ringing, "Bell2")

which calls a routine for the validity test to execute to verify that the actual clock implementation being tested is, in fact, ringing. This is done by designing the verify routine to test the output of the clock that causes a ring to occur. In the case of a clock based upon a digital circuit, this would probably amount to check a "ringing" flag output somewhere in the clock's system.

There is also an action associated with this transition, identified by the string:

A: ringing="TRUE";

This annotation and its postfix equivalent also appear at page 2 of Appendix E. The action sets the variable "ringing" to TRUE, indicating that condition of the clock at this point.

The treatment of this action and test information upon traversal of the model will be covered in Section IV below.

State 308 is now reached, and has three transitions leaving it: edges 308.8, 308.9.1 and 308.9.2. Edge 308.8 is a loop with a predicate, test information, and event and an action (indicated by the letters PTEA along-side). Referring to Appendix E (under "Edge RingBell-1_13"), these are as follows:

> Event: NoPress
> action: rings=rings+1
> predicate: rings<=2
> test information:
> /* no button press */

The "event" here is that the user did not press the shutoff button. This is tested against the working clock model by checking the output that reflects this condition. The test information is a comment string reflecting the condition, and may optionally be printed out by the test program when it is run against a real implementation of a clock.

The action here is to increment the variable "rings" by one, and the predicate, i.e. the condition that must be true for this transition to be taken at all, is that "rings" must be less than or equal to 2. The result of this combination of annotations is that loop 308.8 will be taken until "rings" reaches a value of 3 (i.e. rings>2), and then will be taken no longer. In addition, the "event" of the button not being pressed must hold true for this loop to be taken.

When loop 308.8 times out ("rings" reaches 3) or when the button is pressed, then either transition 308.9.1 or 308.9.2 is taken. Since an EFSMA is deterministic, the three transitions emanating from the BellRinging state (308) are mutually exclusive, and one can always determine which will be taken for a given machine state.

The transitions 308.9.1 and 308.9.2 are alternative transitions, however, and to test the clock completely, both must be traversed-though not, of course, in the same path. Thus, the present system must test both the conditions where "rings" times out after three rings, and where the user presses the button before the timeout occurs.

Transition 308.9.1 includes the following annotations (see Appendix E, page 2, under "Edge RingBell1_15"):

> Event: TimeOut
> action: ringing="FALSE"
> predicate: rings==3
> test information:
> Verify(timeout);
> Verify(not_ringing, "Bell1")

This indicates that the loop 308.8 timed out, as indicated by the event, and sets the variable "ringing" to FALSE. This edge can be taken only if "rings" is equal to 3, which is in fact the case when the loop times out. Finally, two verification tests are annotated to the edge, which will test the clock to determine whether, given the input event, action and predicate, it returns values indicating a condition of timeout and the bell not ringing.

As will be seen in the discussion below of the traversal of the "alarm" EFSMA, the method of the invention causes transition 308.9.1 to be taken in one path, and 308.9.2 to be taken in another path. The latter case will simulate the condition when the shutoff button is pressed, and the annotations for edge 308.9.2 are listed under "Edge RingBell1_17". The event indicates that the "stop" (shutoff) button was pressed the action sets "ringing" to FALSE; the predicate is that "rings" is less than 3; and the test information includes verification tests to simulate that the button was, in fact, pressed ("Force . . . "), and that the bell, as a result, is no longer ringing. If the output in the real clock indicates that the bell is still ringing after the button press is simulated, then a failure condition would be reported by this "verify" routine. It is a straightforward matter to write such a routine, with every such routine's design depending upon the details of the implementation being tested.

The exit state 309 has now been reached by one edge or the other. This brings the procedure back to state 303 in FIG. 5, which is now exited to traverse transition 303.5. There are no annotations on this edge, so state 305 ("clean_alarm") is now reached.

This leads to edge 305.6, which is indicated as having test data, identified in Appendix E, page 1 as the comment "test successful". That is, if in executing the EFSMA the procedure actually reaches this point, it means that all the "verify" routines along the way were successful, and thus that this particular path is confirmed as being correct in the clock being tested. It may, of course, be that another path failed; thus, it might be that the clock fails when the timeout function in Ring-Bell1 is tested, but succeed when the button press function is simulated.

Returning now to state 302, the other transition 302.4 is selected. The foregoing analysis explored only the left half of FIG. 6, and now the right half with the "Ring-Bell2" submodel is traversed. Edge 302.4 includes test information, identified in Appendix E, page 1 as a comment indicating that in this path, the bell should ring at 2 o'clock (event is t2_00), and should continue ringing until a preset duration elapses. Thus, there is a "Force" function to make the time 2 o'clock to test whether this will occur in the real clock.

The submodel RingBell2 is now entered, at start state 310 in FIG. 7. Immediately there are two choices, one being edge 310.11 for when the value for "duration" is greater than or equal to 2, and the other (310.12) for when duration<2 or when Bel12Ringing==TRUE. (Bel12Ringing should first have been initialized to FALSE.)

The first choice, along edge 310.11, includes (in addition to the predicate) the action that Bel12Ringing is set equal to TRUE and the test to verify that the clock indicates a condition where its bell would be ringing. At this point, entry of state 311 calls RingBell2 recursively, so the method proceeds to start state 310. Since Bel12Ringing is now TRUE and the recursion limit for Ring-Bell2 was exceeded (discussed below), edge 310.12 is taken to the exit state 312. In doing so, the action along edge 310.12 is executed, so that Bel12Ringing is reset to TRUE.

When exit state 312 is reached, this is the exiting from the recursive call of RingBell2, which actually leads to state 311 in FIG. 7. Now edge 311.12 is taken, which includes a test to verify that the clock is no longer ringing its bell.

Now state 312 is reached again, but this time at the level of the first call to the RingBell2 submodel, i.e. from the root level, thus leading to edge 304.5 in FIG. 5. No annotations are correlated with this edge, so state 305 is reached.

Edge 305.6 is then traversed, and as with the previous paths, will indicate successful completion of the test of the clock if this point is reached without failure of any verification tests along the way.

By inspection, the total number of paths for the EFSMA 300 in FIG. 5 can be counted: there is one through RingBell2 (only transition 310.11 is taken, because here "duration" equals 2). There are four through RingBell1: one for when the button is pressed when "rings" has each value of 0, 1 and 2, and one for when the submodel times out at "rings"=3. This makes a total of five paths, which is confirmed on page 19 of the trace printout in Appendix F.

The traversal method of the invention effectively carries out the foregoing analysis, but automatically, and in the process generates actual validity tests that will test the real-life working clock. The user provides the EFSMA, based upon the clock's specifications, and authors the verification routines to interact with the clock to test its functions, as well as the header file(s) to declare and initialize variables as necessary.

B. Traversal of the "alarm" model.

Traversal for allpaths coverage (exhaustive testing) is carried out in the following basic steps. Beginning at the start state of the root model, the first transition is taken (if there is a choice, the transition with the lowest-numbered internal identifier is taken first). Proceed to the state at the terminus of the transition, heeding any events, predicates or tests, and taking any actions specified. At the next state, again take the lowest-numbered transition to the succeeding state, and proceed in this manner until an exit is reached. This completes one path, which is saved with along the test information annotations as a path file. Along the way, a model stack is created and maintained to keep track of the models that have been called, and corresponding information. A path stack is also created and maintained, and includes information at every transition and vertex traversed, including model identifiers and changes in variables. At the same time, a variables stack is maintained, so that as the path is "backed up" to take other transitions, previous variable values may be restored to prepare for the alternate paths.

The "alarm" model will be discussed in light of the following:

FIG. 2—the model stack structure
FIG. 3—the path stack structure
FIG. 5—the alarm architecture
FIG. 6—the RingBell1 submodel
FIG. 7—the RingBell2 submodel
Appendix D—pseudocode for the traversal method
Appendix E—table of test information
Appendix F—detailed trace printout of the traversal of the alarm architecture, including model and path stacks
Tables 1 and 2 (appearing above)—postfix symbols and function definitions In the following discussion, "line" or "step" numbers refer to the line-numbered printout of the traversal method listed in Appendix D. "Stages" refer to the stages numbered #0, #1, etc. in Appendix D. References to "trace" numbers will be to the numbering in the trace printout of Appendix F, appearing as {1}, {2}, etc.

1. The stacks used in traversing

There are three stacks used in traversing any model (defined in Section II.D above): the model stack, the path stack, and the variables stack. All of these stacks help keep track of the entire context of the traversal procedure, i.e. the traversal history at any given point. Since there are multiple models in an EFSMA, a given traversed path may begin at the root (topmost) model and "descend" into many different levels of submodels. In recursive calls, the path may go into the same submodel several times. The model stack keeps track of each model that is entered in a given path.

The path stack keeps track of the state of the EFSMA for a given path. The variables stack keeps track of changes in variables at each transition. All of these stacks are used in ensuring that all paths or a selected subset of paths can be traversed without error. The particulars of their use are discussed below.

2. Following the trace printout of the traversal

Referring to Appendix D, the first stage ("#0") in executing the architecture 300 shown in FIG. 5 pushes the root model (i.e. the root model "alarm", which is the architecture 300) onto the model stack. This is reflected in trace 1 in the trace printout of Appendix F, and the model stack at this point appears at trace 2.

Trace 2 of Appendix F shows the status of the model stack after this first step, including:

the model the process presently is in ("alarm").
the caller key ("root\_00", i.e. the "alarm" model).
the depth of iteration of this model (1, for first call level).
return frame pointer ("return fp"), indicating the frame of the model stack the path will return to upon exiting a submodel. The root model in the present embodiment has been assigned return frame pointer −1.
the hit exit flag, indicating whether this path has encountered an exit from the architecture (of course, this is false at this point; the first state cannot be an exit state).
the loop key, a counter for the number of iterations taken for a loop (there is no loop here, so the count is 0).
the invocation type, i.e. the manner in which the current model was called.

Note that these fields correspond to fields 190–250 shown in FIG. 3.

The root model is always, as an initial matter, called as "root", as indicated in the invocation type field; it could later be called as a submodel if there were a recursive call to it (but in this example, there is none).

Next, stage #1 in Appendix D (step 2) indicates that the model parameters and variables must be initialized by executing model declaration statements. For this architecture, at the root level (i.e. the "alarm" model level before calling any submodels) there are two declared variables, as will be seen below, which are initialized as follows (and are shown in trace 4):

Bell2Ringing="FALSE"
duration=2

These variables so not explicitly appear in the diagrams of FIGS. 5–7. However, for every model it is possible to declare and initialize variables of the types described in Section II.B.4.a above. The variables that are declared for each model are shown at the appropriate points in the trace.

At stage #2, the entry state (i.e. start state 301) is selected as the current state (see trace 5), and the current values of all variables in the model are saved. These values are simply the initialized values, as reflected in trace 4. The link count (i.e. the frame control variable) is initialized to zero at step 6 (see trace 6).

In stage #3, the first transition is selected as the current transition. This is transition 301.2 (i.e. transition "alarm\_14") in FIG. 5, going from the start state 301 to the "init_alarm" state 302; see trace 7. This transition is now evaluated, and step 8 in Appendix D determines whether the link count has a value less than the number of transitions originating at the vertex in the current path stack frame (which is frame 0 at this point). Since there is one such transition (301.2) and the link count is 0, this is true, and the method proceeds to step 11.

Steps 12-15 are skipped in this traversal, since this is an all-paths traversal, and they are bracketed, i.e. are only for edge-cover traversal.

Step 16 determines the type of terminal vertex, i.e. the vertex at the terminus of the current edge, namely state 302 ("init_alarm"). It is a normal state, and thus step 16 yields "true". At step 18, the link count for the top path stack frame is incremented; see trace 8. (The current frame in a path stack is often referred to as the "top" frame, although in the present example the "top" frame actually appears at the bottom of the printed-out frames, as at traces 10, 16, 26, 34, etc.)

At step 19, the transition is pushed onto the path stack frame (see trace 9). At this point, too, the path stack index is incremented, which causes it to point to a new path stack frame. The link count in this new path stack frame is initialized to zero (it will be incremented as soon as a transition is taken from a state appearing in the new path stack frame).

On edge 301.2, there are no predicates, constraints or actions, so steps 22 and 32 yield "false". The context (i.e. the variables stack) with the newly initialized variable values (see trace 4) are saved at this point; see step 33. The path stack at this point has a single frame with fields as shown in trace 10.

At step 35, the terminal vertex is set to be the current state, in this case init_alarm (state 302), as indicated at trace 11. Step 36 sends the procedure back to the beginning of stage 3, i.e. step 8, which evaluates as "true", so at step 11 (see trace 12), the next edge is selected, namely edge 302.3 ("alarm_16"). In order to methodically choose new edges, the method of the invention selects the next edge with the lowest object number. Thus, alarm_16 is selected before edge "alarm_18" (edge 302.4 in FIG. 5).

Step 16 evaluates to "false", since the terminal vertex is a submodel, as indicated by the model icon 303 in FIG. 5. Proceeding to step 38, this evaluates as "true", since icon 303 indicates a model (and specifically, a submodel, since it is a model called by another model, i.e. the overall "alarm" model). This is indicated at trace 13.

At step 41, the link count of the current path stack frame is incremented, and step 42 pushes the transition 302.3 onto the path stack frame. This transition (which is the same as "alarm_16" in FIG. 5) is an "inbound" transition, because it enters a model. See trace 15. Step 42 also increments the path stack index, and sets the next frame of the path stack (to which the index now points) to zero.

There are no predicates, constraints or actions, so steps 44 and 52 are false. The context of the calling model (the "alarm" model) is saved at step 53 if any variables have changed (which, at this point, they have not). The path stack at this point appears as in trace 16; note that "trans type" is "I", for "inbound".

At step 55, the invoked model, i.e. "RingBell1" (model 303) is pushed onto the model stack, and external variables are resolved (i.e. any extern variables declared by the model are resolved vis-a-vis their corresponding scope variables from the calling model). See trace 17.

In the submodel RingBell1, any arguments and declarations are executed at step 58. For this model, there will be two declarations, namely initializations of the variables "ringing" and "rings" as follows:
ringing=""
rings=0

At step 59, the invocation type (here, "submodel") is placed in the model stack frame onto which the current model was pushed, i.e. model stack frame 1, indicated at trace 18 as being current by the letter "C". At step 61, the variable values of the called model are saved; see trace 19.

At step 62, the current state becomes the start state of the called model, namely start state 307 shown in FIG. 6; see trace 20. The method then proceeds from step 63 to stage #3, step 8.

Step 8 evaluates as true (since the terminal vertex 308 is a normal state, not a model), and step 11 selects the next edge, which is edge 307.8 ("RingBell1_11); see trace 21. Succeeding steps are carried out as follows:

| Step | Trace | Comment (test evaluation, or action taken) |
|------|-------|---------------------------------------------|
| 16 |  | True |
| 18 | 22 | Link count incremented (to 1). |
| 19 | 23 | Edge 307.8 is pushed onto the path stack. The path stack index is incremented to a point to a new frame, and the link count is re-set to zero. |
| 22 |  | False |
| 32 | 24 | Value of the variable "ringing" is set to "true". Note that trace 24 gives the entire internal identifier for the variable. |
| 33 | 25 | Variable values are saved. |
| 34 | 26 | Printout of current state of path stack. This is a diagnostic only, not an important step in the method of the invention. |
| 35 | 27 | Current state becomes BellRinging (state 308). |
| 36 |  | Go to stage #3, step 8. |
| 8 |  | True |
| 11 | 28 | Edge RingBell1_13 (looped edge 308.8 in FIG. 7) is selected. Note that it has the lowest object number of the three available edges. |
| 16 |  | True |
| 18 | 29 | Link count is incremented to 1. |
| 19 | 30 | Push edge 308.8 onto current path stack frame (i.e. frame 3). The path stack index is incremented, and the new link count (for frame 4) is set to zero. |
| 22 | 31 | False (there are no false predicates or constraints). Specified predicate evaluates to "true". |
| 32 | 32 | Execute action. |

On this edge (308.8), there is a predicate, an action and an event, indicated by the "PTEA" annotation, as follows:

| Predicate: | rings <=2 |
|------------|-----------|
| Action: | rings = rings + 1 |
| Event: | Bell ringing. |

The predicate and action must be executed at this point in the traversal. The "event" is an indicator that the bell is ringing; in the validation test ultimately produced, this will be a test to determine whether the actual implementation being tested, i.e. an alarm clock, is ringing. This is done by testing whether a signal (such as a "ringing" flag or a signal that would cause the clock to ring) is positive.

At step 22/trace 31, the above predicate is evaluated as true; note that at step 58, the value of "rings" had been set to 0. It is now incremented by the action set forth above. This predicate coupled with this action will serve to limit the number of iterations of the loop represented by edge 308.8. Continuing with the trace analysis:

| Step | Trace | Comment (test evaluation, or action taken) |
|---|---|---|
| 33 | 33 | Variables are saved. |
| 34 | 34 | Printout of current state of path stack. |
| 35 | 35 | BellRinging (next state) becomes the current state. |
| 36 | | Go to #3, step 8. |
| 8 | | True; see step 19/trace 30, where the link count was set to 0. |
| 11 | 36 | Edge RingBell1—13 is selected as the "next" edge. (Since the link count is 0, the edge having the lowest object number is considered the "next" edge.) |
| 16 | | True (terminal vertex is still state 308). |
| 18 | 37 | Link count of path stack frame 4 is incremented to 1. |
| 19 | 38 | Push edge 308.8 onto path stack frame 4. The path stack index is incremented, and the new link count (for frame 5) is set to zero. |
| 22 | 39 | False; predicate evaluates to true ((rings = 1) <= 2). |
| 32 | 40 | The value for "rings" is incremented to 2. |
| 33 | 41 | Context is saved. |
| 34 | 42 | Printout of current state of path stack. |

Note at this point that both frame 3 and frame 4 of the path stack identify the current edge as RingBell1—13 (edge 308.8), reflecting iterations of the loop, corresponding to repeated rings of the alarm clock.

a. Building up the variables stack

The variables stack is maintained with all variable changes. It includes one frame for each such change, with a field for each variable of the current model. Thus, at trace 4, the variables stack includes values in two fields: one for Bell2ringing and the other for duration; it can be represented as follows:

| | Variables stack at trace 4: | |
|---|---|---|
| Frame | Field 1 (variable) | Field 2 (variable) |
| 0 | FALSE (var.1) | 2 (var.2) |

Key to variables:
var.1: Bell2Ringing
var.2: duration

Here, the variables stack maintains the respective values of the variables in the fields, and these fields are correlated with the correct variables by a table or other means. The annotations "var.1" and "var.2" are for the sake of clarity, and would not normally be maintained in the variables stack.

With each change of variable, the variables stack adds a new frame, with the previous frame storing the old variable values and the new frame storing the new values. The number of relevant fields in the variables stack is changeable, at any given time depending upon the number of variables having values in the model (or submodel) responsible for the particular stack frame. Thus, at trace 19, where the variables ringing and rings are initialized, a new frame is added to the above variables stack, so it now appears as follows:

| | Variables stack at trace 19: | |
|---|---|---|
| Frame | Field 1 (variable) | Field 2 (variable) |
| 0 | FALSE (var.1) | 2 (var.2) |
| 1 | "" (var.3) | 0 (var.4) |

Key to variables:
var.1: Bell2Ringing
var.2: duration
var.3: ringing
var.4: rings Proceeding in the same manner, by the time the procedure reaches trace 41, the variables stack holds the following values:

| | Variables stack at trace 41: | |
|---|---|---|
| Frame | Field 1 (variable) | Field 2 (variable) |
| 0 | FALSE (var.1) | 2 (var.2) |
| 1 | "" (var.3) | 0 (var.4) |
| 2 | TRUE (var.3) | 0 (var.4) |
| 3 | TRUE (var.3) | 1 (var.4) |
| 4 | TRUE (var.3) | 2 (var.4) |

Key to variables:
var.1: Bell2Ringing
var.2: duration
var.3: ringing
var.4: rings The procedure continues as follows:

| Step | Trace | Comment (test evaluation, or action taken) |
|---|---|---|
| 35 | 43 | Current state is set to BellRinging (state 308 in FIG. 7, which is the terminal vertex for edge 308.8). |
| 36 | | Go to stage #3, step 8. |
| 8 | | True (link count was set to zero in trace 38). |
| 11 | 44 | RingBell1—13 is selected for a third time; it is still the "next" edge, because the link count is zero and it is the edge with the lowest object number. |
| 16 | | True. |
| 18 | 45 | Link count is incremented to 1. |
| 19 | 46 | Push edge 308.8 onto path stack frame 5. The path stack index is incremented, and the new link count (for frame 6) is set to zero. |
| 22 | 47 | False: predicate evaluates to true ((rings = 2) <= 2). |
| 32 | 48 | Increment "ring" to 3. |
| 33 | 49 | Variable values are saved at variables stack frame 5. |
| 34 | 50 | Printout of current state of path stack. |
| 35 | 51 | Current state is set to BellRinging. |
| 36 | | Go to stage #3, step 8. |
| 8 | | True (link count was set to zero in trace 46). |
| 11 | 52 | Ringbell113 is selected for the fourth time; it is still the "next" edge, because the link count is zero. |
| 16 | | True. |
| 18 | 53 | Link count is incremented to 1. |
| 19 | 54 | Push edge 308.8 onto path stack frame 6. The path stack index is incremented, and the new link count (for frame 7) is set to zero. |
| 22 | 55 | True: predicate evaluates to false, i.e. rings (which was incremented to 3 at trace 48) is not <= 2. |
| 24 | 56 | Pop edge 308.8 back off the path stack. Also decrement the path stack index (which was incremented at trace 54, when edge 308.8 was pushed on the path stack), so that the path stack index points to the previous frame (i.e. frame 5), which has a link count of 1. (See trace 50 path stack printout.) |
| 27 | | No variables need to be restored, since none were altered between trace 54 and trace 56 (which might have been the case, had there been a constraint on edge 308.8 that altered a variable). |
| 29 | 57 | Current state is set to the state just popped-which, because of the loop, is the same state BellRinging (state 308). |
| 30 | | Go to #3, step 8. |
| 8 | | True; the link count is 1 and the total number of |

-continued

| Step | Trace | Comment (test evaluation, or action taken) |
|---|---|---|
|  |  | edges off this state is 3. |
| 11 | 58 | RingBell1__15 (edge 308.9.1) is now selected as the next edge. Since the link count is already 1 (see trace 56), Ringbell113 (edge 308.8) will not be selected as before. |
| 16 |  | True; the terminal vertex is exit state 309. |
| 18 | 59 | Increment link count of next frame (path stack frame 6) to 2. |
| 19 | 60 | Push edge 308.9.1 onto path stack frame 6. The path stack index is incremented, and the new link count (for frame 7) is set to zero. |
| 22 | 61 | False: there is a predicate (rings == 3), but the predicate is true. |
| 32 | 62 | Action: ringing is set to equal "false", indicating that (and testing whether) the alarm clock timed out after three rings. |
| 33 | 63 | Save the variables in variables stack frame 6. |
| 34 | 64 | Printout of path stack. |

The variables stack now includes the following:

| Variables stack at trace 63: | | |
|---|---|---|
| Frame | Field 1 (variable) | Field 2 (variable) |
| 0 | FALSE (var.1) | 2 (var.2) |
| 1 | "" (var.3) | 0 (var.4) |
| 2 | TRUE (var.3) | 0 (var.4) |
| 3 | TRUE (var.3) | 1 (var.4) |
| 4 | TRUE (var.3) | 2 (var.4) |
| 5 | TRUE (var.3) | 3 (var.4) |
| 6 | FALSE (var.3) | 3 (var.4) |

Key to variables:
var.1: Bell2Ringing
var.2: duration
var.3: ringing
var.4: rings Continuing with the trace printout:

| Step | Trace | Comment (test evaluation, or action taken) |
|---|---|---|
| 35 | 65 | Set the current state to exit state 309. |
| 36 |  | Go to #3, step 8. |
| 8 |  | The test here is false. Although the link count is zero (see trace 60), the number of transitions originating from this exit state 309 (as from any exit state) is also zero. Proceed to the else statement at step 38. |
| 38 |  | False (the exit state is not a "model invocation"). Proceed to the else statement at step 66. |
| 66 | 66 | True: the current state is a submodel exit (the exit of submodel RingBell1), and the exit state is exhausted, i.e. all loops (of which there are none) have been completed. A transition must be fabricated to return to the calling model, i.e. the "alarm" (root) model. |

The transition that is fabricated from exit state 309 is not a normal transition, but one created solely for the purpose of returning the procedure to the calling model, "alarm". If there were a normal transition from the exit state to the calling model, then the exit state would not cause the correct branching at step 8 (see immediately above), which would evaluate as "true", and the procedure would attempt to process the exit state as a normal state.

Thus, this fabricated transition is used to ensure that the method follows the correct path, while preventing the exit state from being interpreted as a normal state. Other ways of dealing with this are possible.

At step 66/trace 66, the current model has been exhausted, and the path returns to the "alarm" root model of FIG. 5. The path will now proceed out of RingBell1 to transition 303.5, clean__alarm state 305, and transition 305.6, to exit 306, as will be seen in the ongoing trace of the method:

| Step | Trace | Comment (test evaluation, or action taken) |
|---|---|---|
| 71 | 67 | Link count of path stack frame 7 is incremented to 1. |
| 72 | 68 | Push "outbound" transition (the transition fabricated at trace 66) onto the path stack at frame 7. The path stack index is incremented, and the new link count (for frame 8) is set to zero. |
| 75 | 69 | Restore model frame index to that of the calling model. Since we are now exiting submodel RingBell and returning to model "alarm", the model stack must reflect this. Thus, although RingBell is maintained on the model stack (it was placed there at trace 17), the model stack index now points to the root model again. |
| 76 | 70-71 | The path stack and model stack are printed in the trace printout, for reference. Note the "C" adjacent the "alarm" model in the model stack, indicating that this is the current model, i.e. that the model stack index points to this model. |
| 77 | 72 | The context of the "alarm" model is restored if necessary. It is not necessary here, since none of the variables from the root model were altered while the procedure was in the RingBell model. (Such might have been the case if any scope/extern variables had been altered.) |
| 79 | 73 | Current state is set to RingBell1. |
| 84 |  | Go to #3, step 8. |
| 8 |  | This is true; the link count is zero, and the number of transitions is one (i.e. alarm__20, edge 303.5). |
| 11 | 74 | Edge 303.5 (alarm__20) is selected. |
| 16 |  | True. |
| 18 | 75 | Link count of path stack frame 8 is incremented to 1. |
| 19 | 76 | Push transition 303.5 onto path stack frame 8. The path stack index is incremented, and the new link count (for frame 9) is set to zero. |
| 22 |  | False: there are no predicates or constraints on transition 303.5. |
| 32 |  | There are no actions on transition 303.5. |
| 33 |  | No variables have been changed. |
| 34 | 77 | Path stack is printed out. |
| 35 | 78 | Current state is state 305 ("clean__alarm"). |
| 36 |  | Go to #3, step 8. |
| 8 |  | True (there is one edge coming from state 305). |
| 11 | 79 | Edge 305.6 (alarm__24) is selected. |
| 16 |  | True; the terminal vertex of this edge is exit state 306. |
| 18 | 80 | Increment link count of path stack frame 9 to 1. |
| 19 | 81 | Push transition 305.6 onto path stack frame 9. The path stack index is incremented, and the new link count (for frame 10) is set to zero. |
| 22 |  | False: there are no predicates or constraints on edge 305.6. |
| 32 |  | There are no actions on edge 305.6. |
| 33 |  | No variables have been altered. |
| 34 | 82 | Path stack is printed out. |
| 35 | 83 | Current state is state 306 (exit). |
| 36 |  | Go to #3, step 8. |
| 8 |  | False: the link count for frame 10 is zero, and the number of transitions originating from this exit is also zero. Proceed to step 38. |
| 38 |  | False. Proceed to step 66. |
| 66 |  | False. Proceed to step 82. |
| 82 |  | True: the current state is a root model exit. |
| 83 |  | Go to #5, steps 113 et seq., to process a complete path. |
| 114 |  | There are no recursive models in this path. |
| 116 |  | Push exit state onto path stack frame 10. |
| 117 | 85 | Format and output the path stack. |
| 118 |  | This step associates any PFL variables (defined according to the BNF of Appendix A) with variables in the architecture, for any tests or verifications that the user may wish to define. None are present in this example. |
| 120 |  | Test information for each transition is substituted as necessary. See discussion immediately following step 124. |

| Step | Trace | Comment (test evaluation, or action taken) |
|---|---|---|
| 124 | 86 | The completed path file is printed out. | b. Generating the validation test from the path file

The path file for the first completed path appears at trace 86. This path file was generated using the test information contained in Appendix E. Page 1 of Appendix E has the information for each edge of the "alarm" (root) model; page 2, the information for the submodel RingBell1; and page 3, the information for the submodel RingBell2. The path file at trace 86 is generated by following the entire path for path 1 shown in the path stack of trace 85, and at each frame (i.e. each transition), concatenating the test information relating to that frame to the path file.

For each path file generated by the system of the invention, a program shell is created, in the form of:

```
path1(){
    <test information goes here>
}
```

The <test information goes here> indicates where the concatenated test information from the path file will appear. This program shell places the path file in a form for direct execution in the C language (though any other language may be accommodated with the appropriate statements).

After the first open bracket {, the test information associated with edge alarm—14 (frame 0 in the path stack at trace 85) is added. Referring to Appendix E, this includes the following:

```
#include <stdio.h>
#include "alarm.h"
main( )
{
```

These will be recognized as standard initial lines to a C program. The included header file "alarm.h" is defined by the user, and depends upon the interface with the implementation to be tested.

Frame 1 of the path stack for path 1 includes edge alarm—16. Referring to Appendix E, the test information to be added for this edge includes:

```
/*
 * bell1 rings until timeout or button press
 */
Force(time, "8:00");
```

This indicates that for any path including edge alarm—16, the test includes a situation where the bell rings until it times out or until the button is pressed; this is clear by inspection of FIGS. 5 and 6.

This test information also includes a function to force the time to 8 o'clock, which is necessary if the functions of the clock's ringing are to be tested. The 8 o'clock test, as discussed previously, should test both the timeout and the button press causing the alarm to switch off.

The function "Force" is defined by the user in such a way that it interfaces correctly with the real-life alarm dock implementation to set the time at 8 o'clock. If the alarm dock is implemented in the computer where the test program resides, this is a simple matter of defining a call to the alarm dock software. If the alarm clock is a separate, electronic clock, then a computer interface must be available to set the time. In principle, any alarm dock implementation can be tested; the only requirement here is that the Force function be able to set the time, even if this involves driving a device to physically move a time-setting dial or display.

At frame 2 (of the path stack at trace 85), the edge RingBell1—11 is next. Appendix E, page 2 shows the test information associated with this edge:

Verify(ringing, "Bell1");

Like the Force function, this Verify function is user-defined, and depends upon the interface with the actual implementation of the alarm clock. It could be a software interface in the case of an alarm clock implemented in software in the computer, or it could even be a driver for an acoustic detector that "listens" for an actual ring from the clock, and outputs a signal to the path1 test program indicating success or failure.

The Force and Verify functions would conventionally be defined in the "alarm.h" header file.

At frames 3–5 of the path stack (trace 85), the edge RingBell1—13 is traversed thrice. Each time is an indication that the alarm-off button has not been pressed, so the test information associated with this edge in each case is:

/* no button press */

This appears in the path 1 test at trace 86.

Once the edge RingBell1—13 (edge 308.8) has looped thrice, edge RingBell1—15 (edge 308.9.1) is taken. Appendix E indicates the following test information for that edge:

Verify (timeout);
Verify (not_ringing, "Bell1");

These are variations on the Verify function, to verify on the one hand that the ringing actually did time out, and on the other hand that the bell is no longer ringing. They may be defined as subroutines in the earlier verify function, or may be defined as separate functions.

In any of the verify tests, the success or failure of the clock should be reported. Thus, if the clock fails to ring, or fails to complete the timeout, this should be reported. In addition, the test program should exit immediately, since if one portion fails, the rest of the test program becomes meaningless.

The next edge (at path stack frame 7) is NULL; this edge, it will be recalled, was fabricated to ensure exit from the submodel RingBell1 without rising to the level of a normal edge.

Edge alarm—20 (edge 303.5 in FIG. 5) is now encountered, and Appendix E (page 1) indicates that there is no test information associated with it. Edge alarm—24 (path stack frame 9) includes the test information:

```
/*
 *test successful
 */
exit(O);
}
```

This indicates that, if this portion of the program is reached when the test program is executed, the test program has successfully completed, without any verify or other routine causing the program to exit on account of a failure.

The program of trace 86 is thus a complete test program of an implementation against its specification, in this case the specification of the alarm clock. If the clock does not work as specified, diagnostics to this effect will automatically be generated-and likewise, if it passes the test, a success message is generated. The failure messages may be as specific as desired, and would normally indicate precisely which function failed, and at which point in the execution.

c. Backtracking the path file to generate alternate paths

Once a complete path file is generated, the method "backs up" to the most recent branch point, and takes a different route. In a depth-first manner, the method explores all routes through the architecture until every possible path has generated a path file, i.e. a validation test for that path to be executed with the implementation.

By inspection of FIGS. 5-7, it can be determined which paths will be generated. Path 1 (see trace 86) will be backed up, popping states and transitions off the path stack as necessary, and restoring former variable values from the variables stack as necessary, until a previously untaken branch is encountered. The method will then start down that path until an exit of the root model (or of a go-to model) is encountered, which completes another path. Then that path is stored as a path file like that of trace 86, and is backed off until another untaken branch is encountered, and so on.

In the case of path 1, the backing off and popping procedure will pop the following: exit 306; edge 305.6; state 305; edge 303.5; exit 309 of RingBell1 (state 303)—note that we now re-enter this model to begin popping off the states and transitions within; edge 308.9.1 (which we took on the way down this path; see frame 6 of the path stack printed out at frame 85); and state 308. At this point, the path stack frame containing edge 308.9.1 will be popped, putting us back to state 308.

The next edge (308.9.2) will then be tried, but (as will be seen in the discussion below), the value for "rings" will be 3, so the predicate will fail. Edge 308.9.2 will be popped off again, and the previous edge (the third iteration of 308.8) will be popped as well, and the value for "rings" reset to 2. Edge 308.9.1 will be tried, but the predicate will fail, so edge 308.9.2 will be tried, and will succeed because now rings<3. This will lead to a successful new path, shown at trace 146.

Frames are popped off the path stack again and the other paths tried, until the paths at traces 200 and 254 are produced. Finally, the method backs right out of the RingBell1 model up to state 302, and takes the other path (with edge 302.4) through RingBell2 (state 304) and down to the exit. This results in the path file printed out at trace 348, and completes the procedure for the "alarm" architecture.

Following the steps in Appendix F and the trace in Appendix D, it will be found that the above-described actions take place. Path stack frame 10 is popped off, followed by frame 9 (traces 87 and 88). At trace 91, it is found that the state clean_alarm has no other edges out from it, so frame 8 is also popped (trace 92). The same goes for frame 7, which puts the path back into the RingBell1 model (trace 96).

At this point, the variables for the RingBell1 submodel are restored from variables stack frame 6, as indicated at trace 98. Then frame 6 (with edge RingBell1_15) is popped at trace 99. At this point, we are at frame 5 with the path stack index pointing to just-popped frame 6, where the link count (frame control) equals 2; so at trace 102, the next edge selected is RingBell1_17 (this happens at step 11).

RingBell1_17 is pushed onto the stack at step 19 (trace 104), but the predicate fails at step 22 (trace 105), so it is popped off again at step 24 (trace 106). The method then proceeds through the following steps: 27-29-30-8(false)-6(false)-82(false)-86(true)-stage #4-92(false) and then step 93 (trace 109), where frame 5 is popped. The variables are restored (step 110/trace 111), so that rings now equals 2 again.

Proceeding through steps 112-8(true)-11, RingBell1_15 is selected (it is the "next" transition, since the link count equals 1), and the predicate at step 22 (trace 115) is false. Ringbell115 is again popped off (step 24/trace 116), and the method proceeds through steps 27-29-30-8(true)-11 to select RingBell1_17 as the next transition (since the link count has been incremented to 2, it is "next"). This time, the predicate on its edge (step 22/trace 121) is true, since the variables have been restored and rings is once again less than 3.

The rest of the procedure from trace 122 through 146 takes place in the same fashion as the procedure described above for path 1; it simply completes the path that includes frames 0-4 plus a different frame 5 (with edge RingBell1_17 instead of RingBell1_15, as before), and subsequent edges necessarily identical to path 1, since there are no more branches.

The resulting path appears in the path stack at trace 145, and the test for this path appears at trace 146. It is generated in the same fashion as before, using the test information of Appendix E. It covers the case where the bell has rung for two iterations of the loop represented by edge 308.8 (RingBell1_13), and then the user pressed the button to stop it.

A new function appears in this test program, namely:
Force (button, "StopAlarm");
This function would be part of the "alarm.h" header file, and would be designed to interface with the clock implementation to press the button or do the electronic equivalent. The test program of path 2 then verifies that the bell is not ringing.

The method proceeds from trace 147 through trace 200 in the same manner as for path 2, but this time one more iteration of edge RingBell1_13 is removed from the path (at trace 163; see frame 4 at trace 145). When RingBell1_15 is pushed on the stack, the predicate fails, as it did for path 2 (see traces 168-170). Ultimately, edge RingBell1_17 is added to the path (trace 174), and the result is the path represented at trace 199, with the test program for path 3 listed at trace 200. But for the single rather than double iteration of edge RingBell1_13, it is identical to the test for path 2.

Note that this exhaustive coverage may seem superfluous (compare path 2 with path 3); but in systems more complicated than an alarm clock, it is often not foreseeable whether one iteration more or fewer might change the results in a way that would make the system fail. If desired, in such a simple case as the present example, a constraint could be annotated to edge RingBell1_17 to prevent more than one path from being generated that includes both RingBell1_13 and RingBell1_17. Such a constraint might read, in essence:

C: Path does not include more than one iteration of RingBell1_13.

This would make the constraint for path 3 fail (at step 22), and would thus eliminate step 3 from the test programs ultimately produced.

Such a constraint is not part of the automatically generated program, but is placed by the user as an addition to the test information, to be followed at time of traversal of the EFSMA. If a particular traversal is found to generate too many paths (and it is easy to reach millions of paths), then judicious use of constraints can reduce the number of paths and hence the time taken in executing the tests. Once the constraints are placed on the desired edges or on the model as a whole (such as a constraint not to generated any paths including a particular edge or submodel), the traversal method is executed again, automatically producing a new set of test programs with the specified constraints.

The method at trace 201 through 254 accomplishes just what was done for path 3, namely the removal of one iteration of RingBell1__13 from the path, leaving no iterations of that edge. The resultant path (see the path stack at before the alarm the first timeout iteration. The test program at trace 4 tests the actual alarm clock for the correct behavior in this circumstance.

Beginning at trace 255, the method backs up the path, popping off frames, and along the way it is found that all possibilities within the RingBell1 submodel have been exhausted (at step 86/trace 274). Then the method proceeds along steps 92 (false)-93 (trace 275)-94 (false)- 102 (true)-104 (trace 276)-105 (trace 277)-(trace 278). At step 105/trace 277, the model RingBell1 is popped off the model stack.

The path has thus backed up to state 302 (init__alarm), at which point the path stack is reduced to just two frames, at trace 283. Then method proceeds by way of steps 112-8 (true)-11-16 (false)-38 (true)-41-42 (trace 282), where inbound transition alarm__18 is pushed on the stack, and the steps 44 (false)-52 (false)-53 (trace 283)-55 (traces 284–285), where the submodel Ring-Bell2 (vertex 304) is pushed onto the model stack.

The path stack is built up again in this alternate direction. As mentioned above, the submodel RingBell2 (vertex 304) calls itself recursively; see vertex 311 in FIG. 7. This is handled in the normal manner by the method of Appendix F, except that a recursion limit may be placed upon any recursively called submodel such as RingBell2. The recursion limit, which in this example was set to 1, is tested at step 44/trace 304, and lead to the popping of the submodel when it is called once too many times (step 47/trace 305).

Once this occurs, the path completes along edges 311.12, 310.12 (FIG. 7) and 304.5, 305.6 (FIG. 5).

The variable duration was set at the beginning at 2; this allows the method to take edge 310.11, at least until the recursion limit for RingBell2 is reached. Then edge 310.12 is taken, by which time Bell2Ringing, which started as "false", is now "true". Thus, edge 310.12 may be taken even though the second portion of its predicate (duration<2) is false, because the two predicates are OR-ed.

This is reflected in the path stack at trace 313, where first edge RingBell2__18 (edge 310.11) and then edge RingBell2__20 (edge 310.12) is taken. The path proceeds out of the submodel RingBell2 by fabricating an outbound transition (at trace 317), which-because it was a recursive call-takes us right back to the first-time call of RingBell2. This takes the path to the instance of RingBell2 at vertex 311 in FIG. 7, which in effect takes the path to the exit of that iteration of RingBell2, which is vertex 312. Thus, the fabricated outbound transition of a recursive call of a submodel takes one to the exit of the submodel and to whatever transition appears next. This is reflected at frames 4–6 of the path stack at trace 332, showing an outbound (NULL) transition, followed by edge RingBell2__22 (edge 311.12 in FIG. 7), followed by another NULL transition to leave the first call of the submodel RingBell2.

Any number of recursive calls may be handled in this manner, due to the maintenance of the variables stack and the model stack (see trace 333, showing two instances of calling RingBell2). When the path pops out of a model, the context is restored, i.e. the variables are restored based upon the values at the appropriate frame in the variables stack. See trace 334.

Even the root model may be called recursively as a submodel; if this happens, the "invocation type" in the model stack is identified as submodel rather than root; this prevents the path from completing prematurely when the recursive call of the root model exits. Only a go-to model (which may have its own exit separate from the root model) and the root model have exits that lead to the completion of a path.

The remainder of the generation of path 5, at traces 335 through 348, is as before. The resultant path (at trace 347) shows the transitions taken. The resultant test program (at trace 348) includes the function:

Force(time, "2:00");

This function is the same as that for RingBell1 which forced the time to 8 o'clock.

The test program for path 5 tests first whether the alarm clock is ringing when it is forced to 2 o'clock, and then tests whether it has stopped ringing on its own after only one iteration (the recursion limit for RingBell2). If this behavior occurs, then the clock test is successful.

The above principles can be used to model and test a wide variety of real-life systems. A plumbing system, for instance, can be modeled by specifying all of the valve locations and relationships, the flow rates and pressures expected when certain valves are open, and so on. The system may be tested by electronically controlling the valves and using meters to measure the actual flow and pressure, isolating fault conditions.

With the use of multiple-model architectures, quite complex systems may be tested. An airplane, for instance, includes many interrelated subsystems: electronic/computing, hydraulic, pneumatic, and so on. The specification for each subsystem may be modeled as an architecture of yet smaller subsystems, and all of the architectures may be linked together into a single super-architecture. The actual systems of the airplane can be computer-tested in all its variations of operation, with countless testing situations being created and executed automatically. All that is required is for the user to once enter the specification for the system to be tested, and the rest is carried out by the computer and its interface with the implementation, be it an airplane, a clock, an automobile, etc.

We claim:

1. A method for automatically generating at least one test program in a predetermined computer language for testing an implementation of a specification for a predefined system, the specification being expressed as an extended finite state machine (EFSM), the EFSM comprising a root model having a plurality of vertices including a root model start state, a root model exit state, and at least one root model intermediate vertex, the EFSM further having a plurality of transitions, each transition connecting two said vertices and each vertex being connected to at least one other vertex by at least one said transition, the transitions representing functions of the system as defined in the specification, each said transition having zero or more correlated annotations thereto, the annotations including predicates, actions and events defined by the specification and constraints on execution defined by a user, said at least one intermediate vertex including at least one vertex comprising a submodel which itself includes a plurality of vertices including a submodel start state, a first submodel exit state and at least one submodel intermediate vertex, the method comprising traversing the EFSM through at least one path, to generate a path file as a basis for said test program, the method including the steps of:

(1) generating a model stack for tracking, at any given point in the path, the current model for the traversal, the model stack including a model frame index pointing to a current model at any given time in the traversal;

(2) generating a path stack for tracking transitions taken in said path, the path stack including a plurality of frames, each frame having a plurality of fields including at least a field storing a current vertex, a field storing a current transition, and a field storing a link count for determining the number of times a transition has been taken from the current vertex, and a field storing a flag indicating whether any variables values were changed in reaching the current vertex, the path stack further having an index for pointing to a current model stack frame;

(3) generating a variables stack for tracking assignments and value changes for variables used in the specification, the variables stack including a plurality of frames, each frame for storing in a plurality of fields each value taken by each variable in the traversal of the path;

(4) initializing the traversal, including:
pushing the root model onto a first frame of the model stack;
initializing any model parameters and variables defined in model declaration statements of said EFSM;
setting the root model start state as a current state of the traversal; and
saving current values of variables at a first frame of the variables stack;

(5) determining whether the link count for the current path stack frame is less than the number of transitions originating from the current state, and if not, proceeding to step 9;

(6) selecting a next transition from the current state;

(7) determining whether the vertex at a terminus of the current transition is a submodel, and if so, proceeding to step 8, and if not, processing the current transition, including executing any predicates, constraints and actions, updating the path stack with a new frame relating to a new transition if the current transition is taken, updating the variables stack with any changes in values of the variables, and returning to step 5;

(8) processing a submodel invocation, including executing any predicates, constraints and actions, limiting the invocation according to any recursion restraint on the current transition, and updating the model stack with the invoked submodel if the current transition is taken, updating the path stack with a new frame if the current transition is taken, and updating the variables stack if any variable values have changed, and returning to step 5;

(9) if the current state is a submodel exit and all transitions of the current state have been taken and loops from the current state have been completed, generating and taking submodel outbound transition to the calling model, restoring the model frame index to the calling model, restoring the variable values to those of the calling model, setting the current state to the vertex from which this submodel was called, and returning to step 5;

(10) if the current state is the root model exit state, proceeding to step 12;

(11) backing up one state in the path generated so far, including:
popping the most recent frame off the path stack, while maintaining the popped vertex and transition as current;
if an outbound transition from a submodel was popped, popping the path stack again, while maintaining the popped vertex and transition as current, and restoring any changed variables;
if an inbound transition to a submodel was popped, restoring the current model stack index, popping the model stack and restoring any changed variables;
for any other transition, restoring any changed variables; and returning to step 5; and

(12) processing the path to completion, including generating a test program based upon the path taken in said traversal, the test program being in said predetermined computer language and including an interface with said predefined system.

2. The method of claim 1, where step 12 includes the step of returning to step 11, for performing steps 5 through 11 until all possible paths through the EFSM have been traversed.

3. The method of claim 1, where step 12 includes the step of returning to step 11, for performing steps 5 through 11 until a predefined subset of all possible paths through the EFSM have been traversed.

4. The method of claim 1, including the step of limiting the number of times a submodel is called recursively.

5. The method of claim 1, wherein step 7 includes the steps of:
incrementing the link count of the current path stack frame; pushing the selected transition onto the current frame in the path stack, incrementing the path stack index to point to a new frame, and setting the link count to zero;
if there are any predicates or constraints annotated to the current transition that are false, popping the current transition and current state of the stack, decrementing the path stack index, restoring variable values if any were changed in step 7, setting the current state to the state just popped, and returning to step 5;
executing any actions annotated to the current transition;
if any variable values have changed in step 7, saving the new values in a new frame on the variables stack;
setting the current vertex to the vertex at the terminus of the current transition; and
returning to step 5.

* * * * *